United States Patent
Moslehi

[19]

[11] Patent Number: 6,136,165
[45] Date of Patent: Oct. 24, 2000

[54] APPARATUS FOR INDUCTIVELY-COUPLED-PLASMA-ENHANCED IONIZED PHYSICAL-VAPOR DEPOSITION

[75] Inventor: Mehrdad M. Moslehi, Los Altos, Calif.

[73] Assignee: CVC Products, Inc., Rochester, N.Y.

[21] Appl. No.: 08/978,933

[22] Filed: Nov. 26, 1997

[51] Int. Cl.[7] ................................................. C23C 14/00
[52] U.S. Cl. ................................ 204/298.06; 118/723 I; 204/298.15
[58] Field of Search ........................... 118/723 I, 723 IR, 118/723 AN; 156/345; 204/298.06, 298.08, 298.16, 298.34, 298.37

[56] References Cited

U.S. PATENT DOCUMENTS

| | | | |
|---|---|---|---|
| 5,405,480 | 4/1995 | Benzing et al. | 156/345 |
| 5,431,799 | 7/1995 | Mosely et al. | 204/298.06 |
| 5,464,476 | 11/1995 | Gibb et al. | 118/723 |
| 5,571,366 | 11/1996 | Ishii et al. | 156/345 |
| 5,591,493 | 1/1997 | Paranjpe et al. | 427/569 |
| 5,605,599 | 2/1997 | Benzing et al. | 156/643.1 |
| 5,653,811 | 8/1997 | Chan | 118/723 |
| 5,683,548 | 11/1997 | Hartig et al. | 156/643.1 |

OTHER PUBLICATIONS

Bang, et al., "Profile Modeling of Collimated Ti Physical Vapor Deposition," Electrochemical Society Conference, San Francisco, CA, SRC Pub C94184, May 1994.

Cheng, et al., "Directional Deposition of Cu into Semiconductor Trench Structures using Ionized Magnetron Sputtering," unpublished, IBM T.J. Watson Research Center, Yorktown Heights, NY and Department of Nuclear Engineering, University of Illinois, IL, pp. 1–11, date unknown.

(List continued on next page.)

*Primary Examiner*—Benjamin L. Utech
*Assistant Examiner*—Luz Alejandro

*Attorney, Agent, or Firm*—Gray Cary, Ware & Freidenrich, LLP

[57] ABSTRACT

A system and related method are disclosed for performing inductively-coupled-plasma-enhanced ionized physical-vapor deposition process for depositing a material layer on a work piece such as a semiconductor substrate or a thin-film head substrate. Within a PVD process chamber, a plurality of inductive antenna segments axially surround a region between the PVD target/cathode assembly and the work piece. The inductive antenna segments are arranged cylindrically around (or conformlly with respect to the physical-vapor deposition target/cathode) and aligned substantially vertically with respect to the target/cathode assembly and/or the work piece. A first radio-frequency (RF) power source provides electrical power to half of the antenna segments to create a first inductively-coupled plasma source, a second RF power source provides electrical power to the remaining antenna segments to create a second inductively-coupled-plasma source. The two inductively-coupled-plasma sources are operated together to produce a multi-zone inductively-coupled-plasma source that generates a rotating inductively coupled magnetic field for uniform high-density PVD plasma generation. The system and method of this invention can be used to produce a much higher ionization ratio for the sputter species to allow ionized PVD collimation or programmable (adjustable) electrical collimation for improved step coverage and bottom coverage depositions on substrates with patterned high-aspect-ratio topography features. Moreover, the system and method of this invention can be used to perform PVD processes at reduced operating pressures (down to 0.1 mTorr or less) with stable ICP-assisted plasma generation. Furthermore, the system and method of this invention can be used to enable very repeatable depositions of ultrathin layers by providing a capability to generate and sustain a highly stable PVD plasma medium using a multi-zone ICP source and allowing the use of reduced PVD target power levels to enable reduced deposition rates.

32 Claims, 9 Drawing Sheets

OTHER PUBLICATIONS

Dew, et al., "Spatial and angular nonuniformities from collimated sputtering," *J. Vac. Sci. Technology*, B11(4), vol. 11, No. 4, pp. 1281–1286, Jul./Aug. 1993.

Hamaguchi, S. and S.M. Rossinagel, "Simulations of trench-filling profiles under ionized magnetron sputter metal deposition," unpublished, IBM T.J. Watson Research Center, Yorktown Heights, NY, pp. 1–16.

Inoue, et al., "Behavior of TiN and Ti Barrier Metals in Al–Barrier–Al Via Hole Metallization," *J. Electrochem. Soc.*, vol. 141, No. 4, pp. 1056–1061, Apr. 1994.

Joshi, et al., "Collimated Sputtering for Refractory Metal Liners for Sub–Half Micron Technology," *Conference Proc. LSI–VIII, Materials Research Soc.* pp. 273–279, 1993.

Onuki, et al., "Study on step coverage and (111) preferred orientation of aluminum film deposited by a new switching bias sputtering method," *Appl. Phys. Lett.*, 53(11), pp. 968–970, Sep. 12, 1988.

Ramaswami, et al., "Development of a Coherent Ti/TiN Process for Sub–Half Micron Technologies," *Advanced Metalization for ULSI Applications in 1993*, pp. 215–221, Oct., 1993.

Rossnagel, S.M. and J. Hopwood, "Magnetron sputter deposition with high levels of metal ionization," *Appl. Phys. Lett.*, vol. 63, No. 24, pp. 3285–3287, Dec. 13, 1993.

Rossnagel, S.M. and J. Hopwood, "Metal ion deposition from ionized mangetron sputtering discharge," *J. Vac. Sci. Technology*, B 12(1), pp. 449–453, Jan./Feb., 1994.

Taylor, et al., "Conformality of Collimated Sputter Deposited Ti Films," *Conf. Proc. ULSI–VIII, Materials Research Society*, pp. 353–357, 1993.

APPARATUS FOR INDUCTIVELY-COUPLED-PLASMA-ENHANCED IONIZED PHYSICAL-VAPOR DEPOSITION

TECHNICAL FIELD OF THE INVENTION

The present invention relates to a method and system for plasma-assisted processing of microelectronics devices, and, more particularly, to a method, apparatus, and system for performing ionized physical-vapor deposition processes, such as those that are utilized to produce semiconductor integrated circuits, data storage thin-film heads, flat-panel displays, photovoltaic devices, and other devices used in electronics and information systems.

BACKGROUND OF THE INVENTION

Plasma-assisted physical-vapor deposition (PVD) using various sputtering target materials is a commonly used thin-film fabrication technology for manufacturing of semiconductor, data storage, flat-panel display, and photovoltaic devices. Plasma sputtering is the most important PVD fabrication technique. In semiconductor integrated circuit (IC) manufacturing, PVD processes are utilized to deposit contact/via barrier (e.g., TiN or TaN) and glue (e.g., Ti) layers as well as metallization materials (e.g., Al or Cu). State-of-the-art semiconductor technologies developed for producing high-performance logic devices such as microprocessor chips employ four to six levels of metal interconnects. Current salicided CMOS technologies with four levels of interconnects may use (a) one PVD step (e.g., Ti deposition) to form self-aligned silicide (i.e., salicide), (b) two PVD steps to deposit Ti and TiN layers at the contact level, (c) one PVD step such as a PVD reflow process to form the contact plug and the first level of interconnect (typically Al, plus 1% Si, and 0.5% Cu), (d) one PVD step to deposit an Anti-Reflection Coating (ARC) layer to facilitate the interconnect patterning process, and (e) between six to nine additional PVD process steps to form the three additional interconnect levels and associated via liner and barrier layers as well as the ARC layers. This process description illustrates that advanced semiconductor IC manufacturing technologies with multiple levels of interconnect often require numerous PVD process steps, some with stringent step coverage and bottom coverage requirements in order to produce continuous coverage over high aspect-ratio contact and via structures.

The performance, reliability, and yield of the multilevel interconnects strongly influence the reliability and manufacturing yield of semiconductor chips such as high-performance microprocessors. As a result, PVD fabrication processes play a significant role in semiconductor integrated circuits, since they influence all the significant multilevel interconnect performance and reliability parameters.

Existing commercial PVD technologies usually employ DC magnetron sputtering in vacuum chambers. A typical commercial PVD equipment includes a single-substrate (single-wafer) vacuum process chamber (preferably designed as a cluster tool module), a temperature-controlled chuck (with the option to apply electrical bias power to the chuck) to hold the substrate, and a sputter target (or magnetron cathode) that contains the desired material. DC magnetron plasma excitation (with DC power levels up to 10 kW to 20 kW) is usually used for sputter deposition of electrically conductive materials such as Al, Ti, Co, and TiN. RF magnetron sputtering is usually used for sputter deposition of electrically insulating (or resistive) materials. RF diode sputtering (as opposed to magnetron PVD sputtering) is the preferred choice for sputter deposition of some magnetic materials and insulating materials for applications such as thin-film head fabrication.

Each of these PVD methods generates a plasma from an inert plasma gas such as Ar and sustain the plasma near the target area. The target material atoms or molecules are then sputtered from the target surface and deposited on the device substrate. Sputter etching of the target occurs due to the impact of energetic Argon ion species. During the sputtering process, the sputtered species (mostly neutrals) are emitted within the vacuum chamber plasma environment over a wide range of spatial angles and a portion of the sputtered flux deposits on the device substrate. Other sputtering processes, such as reactive sputtering processes, use nitrogen or oxygen or another reactive gas, instead of, or in addition to, an inert gas within the vacuum chamber. Reactive magnetron sputtering processes that deposit TiN layers from elemental Ti targets illustrate an example of this technique.

In general, the flux of the sputter atoms or species that the PVD target material emits has a relatively broad angular distribution. Similarly, the sputter flux of species arriving at the substrate surface has a relatively broad distribution angle. This broad distribution angle does not present a problem in applications involving substrates without high aspect ratio features or with relatively minor surface topography features.

However, some semiconductor device manufacturing applications involve substrates with high aspect ratio features. These applications require some degree of spatial filtering or collimation for the sputter species. A broad angular distribution of the PVD flux implies poor collimation or a low degree of collimation, whereas a narrow angular distribution relative to the perpendicular axis indicates a higher degree of PVD collimation. For instance, semiconductor interconnect applications require collimated sputtering for deposition of the contact and via liner/glue and barrier layers (e.g. Ti/TiN) when using high aspect ratio (for instance, on the order of $\geq 3:1$) contacts and vias due to the bottom coverage and sidewall coverage requirements. For a contact/via hole of width (or diameter) W and height H, the following parameters can be defined:

$$\text{A.R.} \triangleq \frac{H}{W} \text{(aspect ratio)}$$

$$\text{Bottom Coverage} \triangleq \frac{t_b}{d}$$

$$\text{Sidewall Coverage} \triangleq \frac{t_s}{d} \text{(stop coverage)}$$

where d is the thickness of sputtered material layer on extended flat top surfaces, $t_b$ is the sputtered material thickness at the bottom of the hole, and $t_s$ is the thickness of the sputtered material on the hole sidewall at mid height.

In conventional PVD processes without any built-in sputtering collimation feature, the bottom coverage and sidewall coverage of the sputter deposited material degrades significantly as the microstructure aspect ratio increases. This degradation becomes increasingly and rapidly worse for microstructure aspect ratios of greater than 3:1. As a result, for applications requiring good bottom coverage (e.g., $\geq 25\%$) and sidewall coverage ($\geq 50\%$), existing PVD technologies use a collimator plate placed between the PVD target or cathode assembly and the substrate inside the vacuum chamber as shown in FIG. 1 (prior art). This collimator plate provides a physical collimation technique.

The collimator plate, usually made of aluminum or titanium, consists of an array of circular or hexagonal (honeycomb) closely packed holes (see FIG. 1(b) that typically have an aspect ratio of 1.5:1 or higher. The collimator plate operates as a spatial filter to reduce the angular distribution of the sputter flux species arriving at the substrate. The degree of collimation increases (thus decreasing the angular distribution of the sputter flux species at the substrate) as the collimator plate hole aspect ratio increases. Although physical collimation via a fixed collimator plate is extensively practiced in commercial PVD equipment for semiconductor contact/via glue/liner and barrier layer depositions, it has a number of drawbacks and disadvantages.

First of all, a trade-off exists between the sputter deposition rate (throughput) and the degree of collimation. In other words, higher degrees of collimation require collimators with higher aspect ratios, resulting in a reduced deposition rate. This trade-off in physical collimated PVD systems presents a significant throughput limitation. Secondly, the collimator becomes gradually coated with the sputtering material. This can result in particulate generation within the PVD vacuum chamber. Moreover, the coating creates a non-uniform blockage of the collimator holes that can result in long-term drift of the process uniformity. These problems lead to the requirement for frequent removal and cleaning of the collimator plate. The need for frequent cleaning and maintenance of the collimator has a negative impact on the overall equipment uptime and product throughput. Finally, a fixed collimator plate does not allow for variable (adjustable in real time) and controlled degrees of collimation, since the degree of collimation is fixed by the aspect ratio of the collimator. Some processes require multi-step depositions with and without PVD collimation in order to maximize the process throughput while, at the same time, establishing optimal hole or trench filling capability. These processes must use multiple PVD stations (including PVD stations or modules with collimation and those without collimation) on a cluster tool which results in an increased cost-of-ownership for the multi-step process.

Another prior art PVD collimation method is the "natural collimation" or "long-through" collimation method. The natural collimation method relies on providing a relatively large spacing (as compared to the sputtering cathode and substrate diameters) between the target and the substrate. In this collimation technique, higher collimation ratios require larger target to substrate spacing values. Like the physical collimation method with a collimator plate, the natural collimation technique also suffers from a trade-off between the degree of collimation and the deposition rate. Moreover, a higher collimation ratio in a natural collimation method results in a higher PVD chamber volume, requiring a higher pumping speed pump package.

Thus, there is a need for an ultraclean PVD collimation technique which does not generate particulates and does not require regular and frequent replacement or cleaning of the PVD chamber components.

Moreover, there is a need for an improved PVD collimation that does not suffer from a trade-off between the deposition rate and the degree of PVD collimation.

There is also a need for an improved collimation technique which provides a capability for adjustable and controlled collimation (programmable electrical collimation) of the PVD process in real time. The collimation control capability will be established via a controlled and adjustable electrical parameter (substrate bias, ionization source RF power, or both of these parameters) with or without a capability to adjust the target-to-substrate spacing.

There is also a need for a PVD technology that can perform high throughput processing of substrate using high rate deposition with enhanced processing capability without requiring higher PVD chamber volume.

There is also a need for a PVD technology that can deposit material layers with excellent thickness control and process control capability for a wide range of material layer thicknesses from very thin (down to 10 Å) to relatively thick layers.

There is also a need for a PVD technology that provides a capability to sustain a stable and reproducible plasma medium for a wide range of PVD cathode power levels (e.g., from zero to the highest power level on the cathode).

SUMMARY OF THE INVENTION

The present invention provides an apparatus and method for processing a substrate such as a semiconductor wafer using physical-vapor deposition (PVD) (particularly plasma sputtering) that substantially eliminates or reduces disadvantages and problems associated with previously developed PVD techniques for deposition of various material layers.

More specifically, the present invention provides a system and method for performing an inductively-coupled-plasma-assisted PVD or an ionized PVD process for depositing a material layer on a work piece such as a silicon wafer. Within a PVD process chamber, a plurality of antenna segments axially surround a target/cathode assembly. The antenna segments are arranged cylindrically around (or conformally with respect to the cathode periphery) and substantially vertically aligned with the target/cathode. A first radio-frequency (RF) power source couples to half of the antenna segments to create a first inductively-coupled plasma (ICP) source, a second RF power source couples the remaining antenna segments to create a second inductively-coupled plasma (ICP) source. The two inductive or ICP sources are then operated concurrently to produce a combined multi-zone inductively coupled source, that generates a rotating and time-varying inductively-coupled magnetic field approximately parallel to the target/cathode, that couples additional electrical energy into the plasma medium from the RF power sources, and increases the ionization ratio of the PVD sputter species. The ICP source also provides a capability for establishing enhanced plasma density in the PVD plasma medium.

The system and method of this invention can be used to produce a much higher ionization ratio for the sputter species to allow ionized PVD collimation or programmable (adjustable) electrical collimation for improved step coverage and bottom coverage depositions on substrates with high-aspect-ratio topography features. Moreover, the system and method of this invention can be used to perform PVD processes at reduced operating pressures (down to 0.1 m Torr or less) with stable ICP-assisted plasma generation. Furthermore, the system and method of this invention can be used to enable very repeatable depositions of ultrathin layers by providing a capability to generate and sustain a highly stable PVD plasma medium using a multi-zone ICP source and allowing the use of reduced PVD cathode power levels to enable reduced deposition rates.

The present invention provides an important technical advantage of an improved PVD collimation technique that does not suffer from a serious trade-off between the deposition rate and the degree of PVD collimation.

Another technical advantage of the present invention is that it provides an ultraclean PVD process that eliminates or greatly reduces particulate generation due to collimation, and does not require regular and frequent replacement or cleaning of a physical collimator due to the lack of need for it.

The present invention provides another technical advantage by providing the capability to adjust and control the degree of collimation (programmable electrical collimation) of the PVD process in real time. The present invention can implement variable collimation via a controlled and adjustable electrical parameter (substrate bias, ionization source RF power, or both of these parameters).

The present invention provides another technical advantage by performing high throughput processing of substrate using high rate deposition with enhanced processing capability that does not require an increased PVD chamber volume.

Another technical advantage of the present invention is the capability for increased PVD deposition rate by the enhanced plasma density assisted by the inductively-coupled source.

A further technical advantage of the present invention is the capability to provide a highly repeatable PVD process for repeatable deposition of ultrathin (down to 5–20 Å) layers by ICP-assisted generation of a stable plasma allowing the use of very low or reduced electrical power levels on the PVD cathode.

BRIEF DESCRIPTION OF THE DRAWINGS

For a more complete understanding of the present invention and the advantages thereof, reference is now made to the following description which is to be taken in conjunction with the accompanying drawings in which like reference numerals indicate like features and wherein.

DETAILED DESCRIPTION OF THE INVENTION

Preferred embodiments of the present invention are illustrated in the FIGURES like numerals being used to refer to like and corresponding parts of the various drawings.

The present invention involves an improved inductively-coupled-plasma-enhanced (ICP-enhanced) PVD process for depositing a material on a work piece (typically a substrate or wafer) in microelectronics manufacturing processes including semiconductor integrated circuits and thin-film heads. The present invention employs two sets of inductive coupling antenna segments axially surrounding the region between the target/cathode assembly and the substrate. Both sets of antenna segments are arranged cylindrically and substantially vertically aligned with the target/cathode assembly. A first RF power source is connected to the first set of inductive coupling antenna segments, a second RF power source is connected to the second set of inductive coupling antenna segments, and the two sets of inductive coupling or ICP antenna segments and associated power sources are operated together to create an inductively coupled plasma source within the PVD chamber. The multi-zone inductively coupled plasma source generates a rotating and time-varying inductively coupled magnetic field approximately parallel to the target/cathode (the magnetic field vector may be made perpendicular to the target/cathode assembly as well) to increase the ionization ratio of the PVD sputter species and to enhance the PVD plasma density within the PVD process chamber. The present invention improves the deposition process to allow a higher throughput PVD rate for various applications including processes involving substrates with high aspect ratio features. Also, the present invention provides a capability for adjustable collimation rates by either controlling the PVD ionization ratio (by adjusting the ICP RF power levels) or by controlling the amount of substrate bias. The ICP-enhanced PVD apparatus and method of this invention also enable sputter deposition at lower pressures by producing a stable plasma over a wide range of operating pressures.

Figure 2:
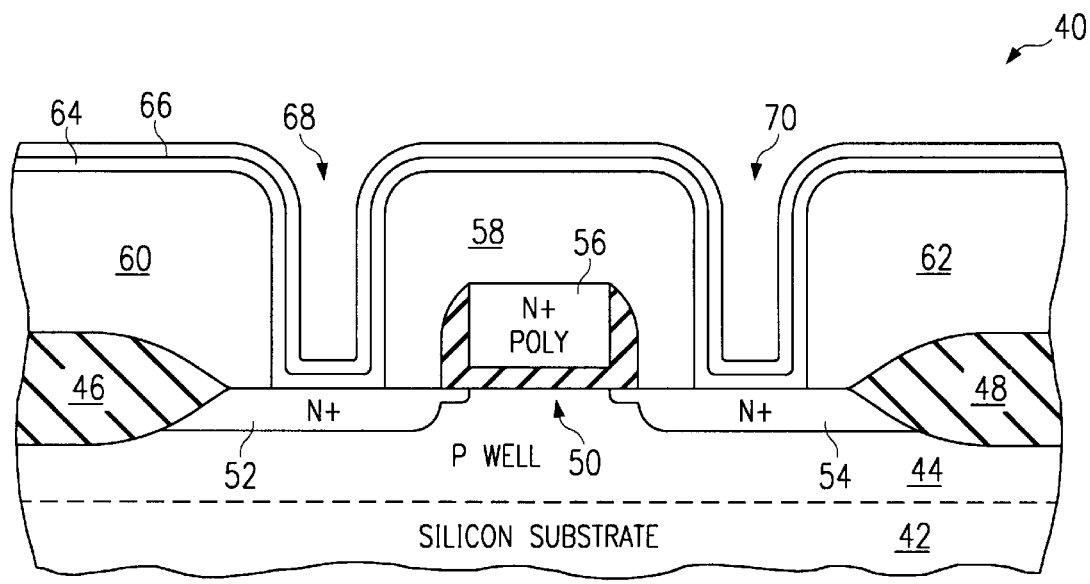
FIGS. 2 and 3 demonstrate the device topography features as well as the bottom and sidewall coverage of semiconductor devices formed using collimated PVD processes.
Figure 3:
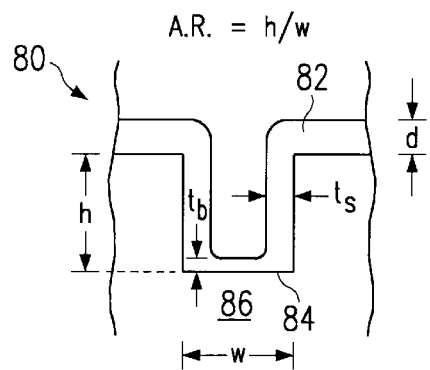

FIGS. 2 and 3 illustrate representative bottom and sidewall coverage of high-aspect-ratio features on semiconductor devices using collimated PVD processes. FIG. 2 shows a cross-section of a Metal-Oxide-Semiconductor Field-Effect Transistor (MOSFET) with the interconnect glue layer 64 and barrier layer 66 formed over the contact structure by PVD, and indicates the requirements a PVD process must meet for such application. In FIG. 2, transistor or MOSFET device structure 40 is fabricated on a silicon substrate 42. Doped P-well 44 is partially covered by device isolation field oxide layer 46 and 48. Gate dielectric region 50 is formed over the device (MOSFET) channel between the N+-doped source 52 and drain 54 junctions. N+ poly-silicon gate electrode 56 is formed over the gate dielectric 50 between the N+-doped source 52 and drain 54 junctions. An inter-level dielectric (ILD) layer is then formed over the MOSFET device structure and is subsequently patterned to form the interconnect contact holes, such as the source contact hole 68, the drain contact hole 70, and the gate contact hole (not shown) within the ILD layer 58, 60, 62. Titanium glue layer 64 covers the sidewalls and bottoms of contact holes as well as the ILD regions 58, 60, and 62. Titanium nitride (TiN) barrier 66 covers titanium layer 64 over the same regions. Contact hole 68 over the MOSFET source junction 52 is shown between the ILD regions 58 and 60. Moreover, contact hole 70 formed over the drain junction 54 is shown between the ILD regions 58 and 62.

FIG. 3 shows in more detail the contact or via hole structure 80 for which a collimated PVD process must be used to deposit the glue and/or barrier layers. For instance, a collimated PVD process such as ionized PVD deposits layer 82 over contact/via hole 84 on substrate 86. As FIG. 3 depicts, the desired layer 82 has a top surface thickness d, with a sidewall layer thickness $t_S$ and a bottom thickness $t_B$ within the contact/via hole with a diameter (width) of w and height of h (Aspect Ratio=$h/w$). This is a simplified schematic diagram since in practice the sidewall layer thickness varies between the top and the bottom of the sidewall (similarly, the layer thickness varies between the center and corner of the contact/via hole bottom).

In practice, the PVD processes always result in $t_S$<d and $t_B$<d, and the thickness ratios $$\frac{t_S}{d} \text{ and } \frac{t_B}{d}$$

become smaller as the contact/via aspect ratio increases. A collimated PVD process such as ionized PVD of this invention improves the sidewall coverage and bottom coverage by increasing the thickness ratios $$\frac{t_S}{d} \text{ and } \frac{t_B}{d}.$$

Figure 1A:
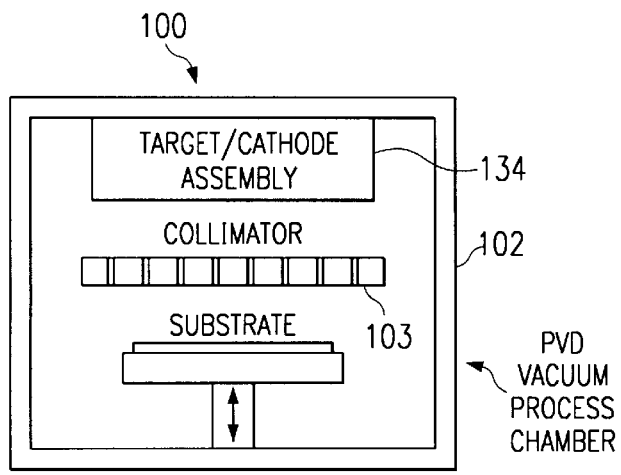
FIG. 1(a) shows a prior art PVD system including a physical collimator.
Figure 1C:
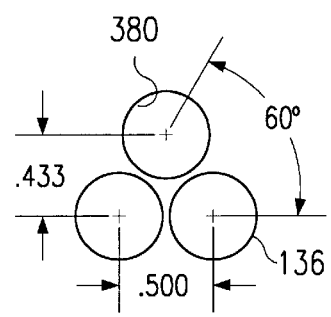
FIGS. 1(b) and 1(c) illustrate a physical collimator plate.
Figure 1B:
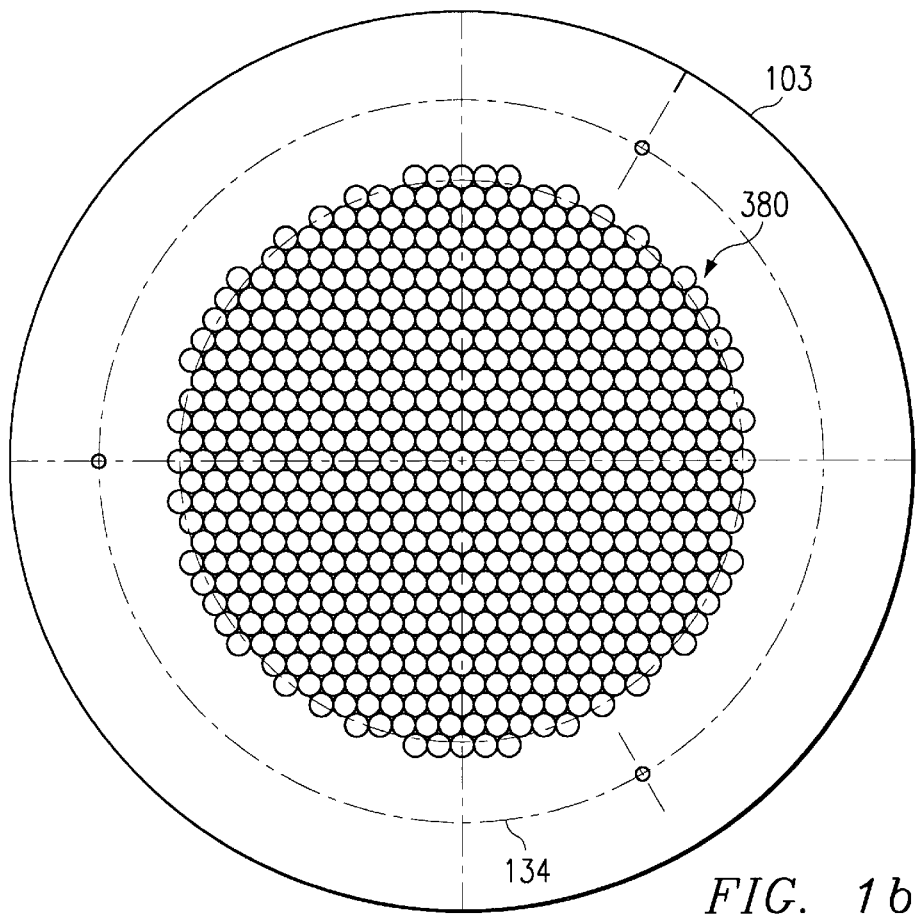

FIG. 1(b) shows a physical collimator that the present invention can replace. Collimator 103 includes numerous cylindrical or honeycomb passageways 380 for collimating the sputtered species within process chamber 100. FIG. 1(a) shows the position of collimator 103 as it may appear within process chamber vacuum boundary 102 and beneath target 134. FIG. 1(c) shows the collimator passageway 380 for a cylindrical hole configuration for collimating the sputtered species that are emitted from the PVD target.

Figure 4:
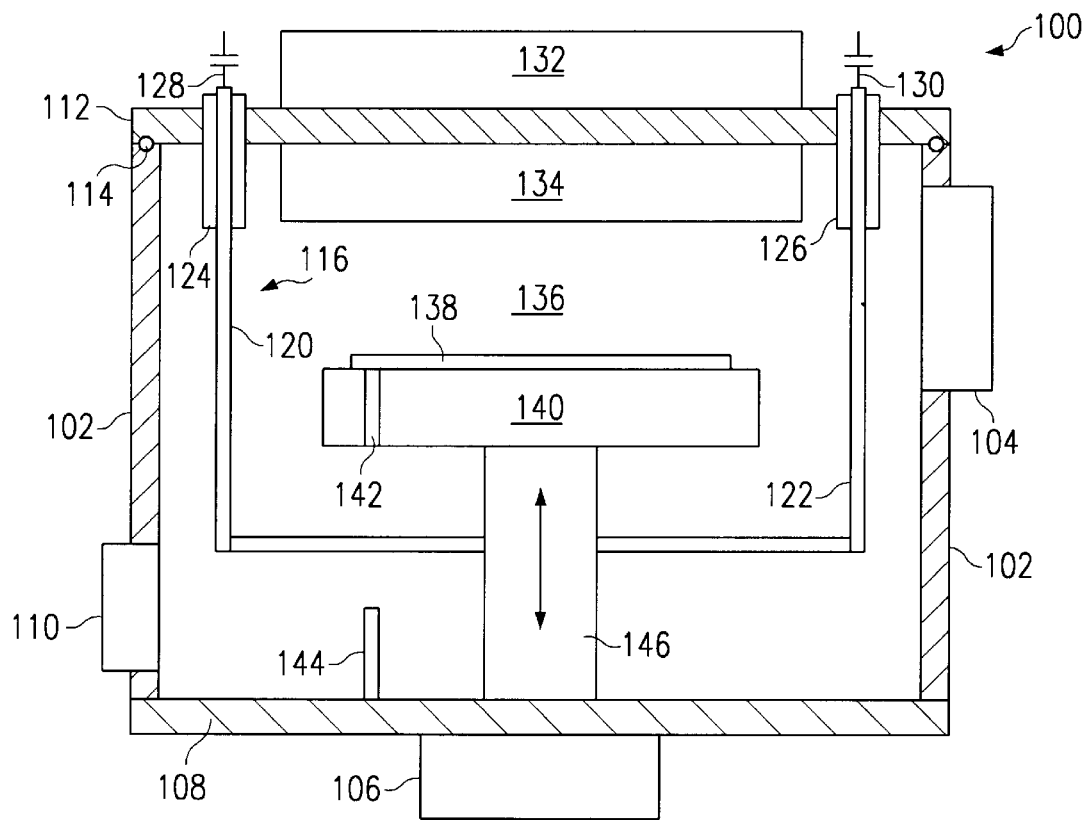
FIG. 4 depicts a PVD vacuum process chamber with one embodiment of the invention.

FIG. 4 depicts a PVD plasma sputtering process chamber containing a Multi-Segment Inductively Coupled Plasma (MS-ICP) source (to be operated as a multi-zone ICP source). More specifically, FIG. 4 shows a side cut-away view of a PVD fabrication reactor process chamber 100 including an embodiment of the present invention. Process chamber 100 includes vacuum chamber sidewalls 102 to which vacuum pump port 104 attaches. Chuck drive 106 (used for up/down motion of the chuck) attaches to vacuum base plate 108 of process chamber 100. Wafer transport valve 110 permits loading and unloading of substrates between the PVD process chamber 100 and a wafer handling robot. Vacuum top lid 112 seals process chamber 100 through O-ring seal 114 to PVD chamber wall 102.

FIG. 4 shows two antenna portions of the multi-zone, multi-segment inductively coupled plasma (ICP) source 116 for ICP-enhanced and/or ionized PVD according to the present embodiment of the invention. In particular, multi-zone ICP source 116 includes a plurality of substantially axial antenna segments, including antenna segments 120 and 122 that connect to coaxial feedthrough terminals 124 and 126. Each antenna segment preferably connects to an RF capacitor (as shown by RF capacitors 128 and 130 connected to antenna segments 120 and 122, respectively). Coaxial feedthrough connectors 124 and antenna segment 120 penetrate through top vacuum lid 112, as do antenna segment 122 and coaxial feedthrough connector 126. In this configuration, the RF feedthroughs and related antenna segments can be formed to be an integral part of the PVD cathode/target assembly 134 as shown in FIG. 4. Series RF capacitors 128 and 130 connect, respectively, to axial antenna segments 120 and 122. In DC magnetron PVD equipment, rotating magnet array assembly 132 associates with top vacuum lid 112 above cathode/target assembly 134. In non-magnetron PVD applications such as RF diode PVD, this magnet assembly 132 is not used. Cathode/target assembly 134 is separated from substrate 138 by adjustable wafer-to-target spacing 136 controlled by the up/down actuation mechanism 146 of the adjustable-height chuck 140.

Cathode/target assembly 134 comprises a target material and the provisions for electrical powering of target. Work piece or substrate 138 rests upon adjustable height chuck 140 which may also provide temperature regulation and control capability. Chuck 140 includes passage way 142 for receiving wafer lift pin 144. Wafer lift pin 144 permits lifting substrate 138 as chuck drive shaft 146 moves chuck 140 downward, in order to enable loading or unloading of substrate 138.

Figure 5:
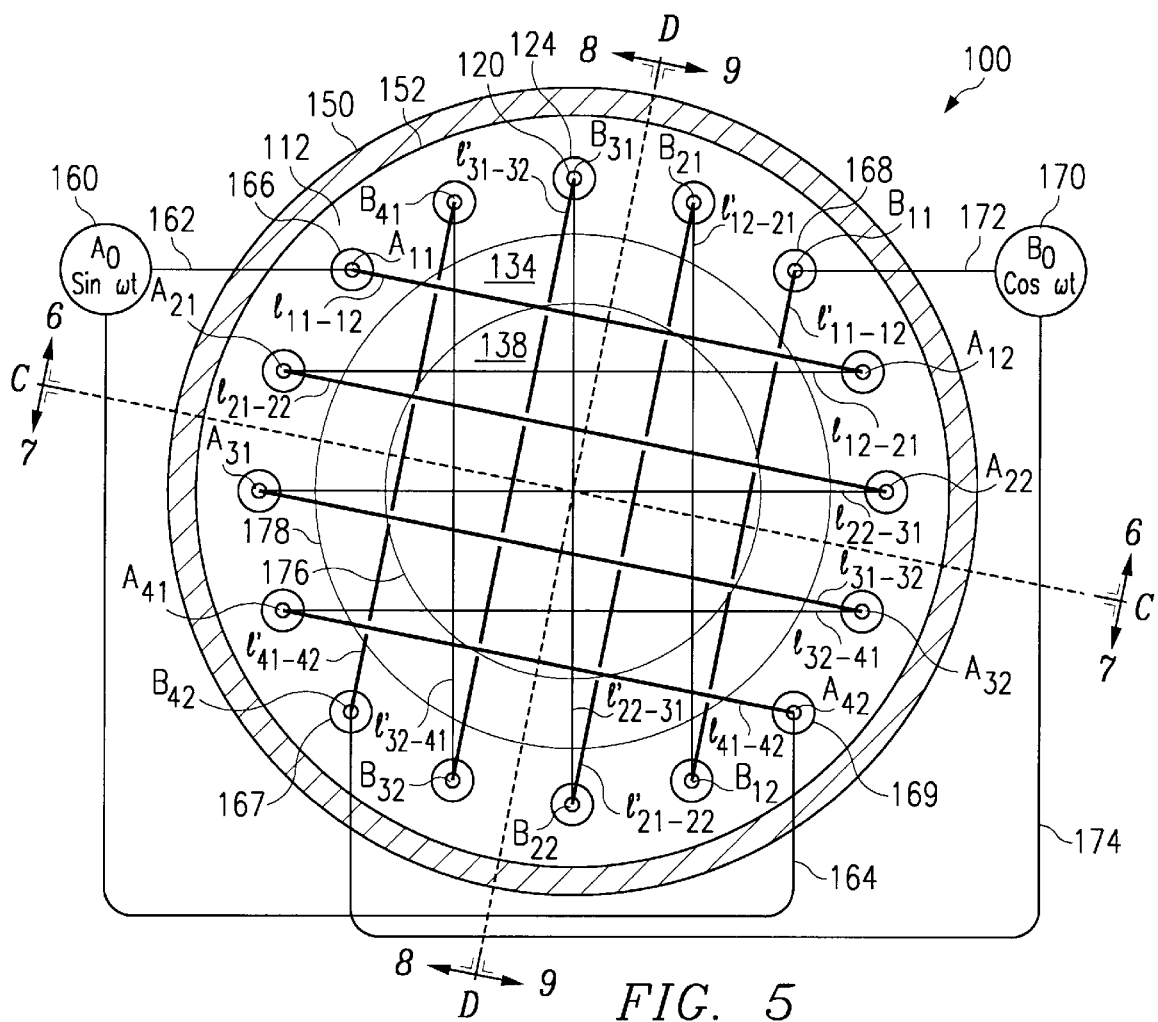
FIG. 5 shows the ICP antenna connections and the external antenna terminal connections for the embodiment of the present invention described in FIG. 4 (the thick lines show the electrical connection, on one side while the thin lines show the external antenna connections on the opposite side)

FIG. 5 shows a schematic top view of ICP-enhanced PVD process chamber 100 that illustrates the external electrical connections and internal antenna links for the embodiment of FIG. 2 with a 16-segment multi-zone antenna configuration. For process chamber 100, the vacuum process chamber is shown between the internal boundary 152 and atmospheric or external boundary surface 150. In FIG. 5, all vacuum electrical feedthrough connectors (shown as $A_{ij}$ and $B_{ij}$) are placed in the vacuum top lid 112. The thin and thick straight lines represent the external and internal electrical links, respectively, for the antenna segments. Antenna segment 120, associated with coaxial feedthrough connector 124, penetrates through vacuum top lid 112 at the top of process chamber 100. The embodiment described in FIG. 5 shows sixteen inductive antenna segments, eight of which connect to a first RF power supply 160 (shown as $\text{Sin}(\omega t)$ source), and eight of which connect to a second RF power supply 170 (shown as $\text{Cos}(\omega t)$ source). As indicated, these two RF power supplies preferably have the same RF frequencies (e.g., 13.56 MHz) and operate with a 90° phase shift with respect to one another. Beginning at first RF power supply 160, electrical link 162 connects one terminal of the power supply to antenna feedthrough connector terminal $A_{11}$. The link $1_{11-12}$ represents the internal electrical link between the bottom ends of the antenna segments connected to electrical feedthroughs $A_{11}$ and $A_{12}$ (the internal or vacuum side links are simply continuous extensions of the vertical antenna segments but positions in horizontal plans and conformal to the chamber wall surface). The various feedthrough connectors $A_{12}$ and $A_{21}$ are connected together via external electrical link or cable $1_{12-21}$. The link $1_{21-22}$ represents the internal electrical link between the bottom ends of the antenna segments connected to the vacuum feedthrough connectors $A_{21}$ and $A_{22}$. The external connector $1_{22-31}$ links the vacuum feedthrough connectors $A_{22}$ and $A_{31}$. Line $1_{31-32}$ represents the internal electrical link between the bottom ends of the antenna segments connected to the vacuum feedthrough connectors $A_{31}$ and $A_{32}$. External electrical connector $1_{32-41}$ connects the vacuum feedthrough connectors $A_{32}$ and $A_{41}$. The internal electrical link $1_{41-42}$ connects the bottom ends of the antenna segments connected to vacuum electrical feedthroughs $A_{41}$ and $A_{42}$. Finally, the vacuum feedthrough connector $A_{42}$ is connected to the second terminal lead of the first RF power supply or $\text{Sin}(\omega t)$ power supply 160 via connector cable 164.

The second inductive coupling RF power supply 170 connects via line 172 to antenna vacuum feedthrough connector terminal $B_{11}$. Line $1'_{11-12}$ represents the internal electrical link connecting the bottom ends of the antenna segments connected to vacuum feedthrough connectors $B_{11}$ and $B_{12}$. Vacuum feedthrough connector terminals $B_{12}$ and $B_{21}$ are connected together by external cable link $1'_{12-21}$. Line $1'_{21-22}$ represents the internal electrical link between the bottom ends of the antenna segments connected to vacuum feedthrough connectors $B_{21}$ and $B_{22}$. Vacuum feedthrough connectors $B_{22}$ and $B_{31}$ are connected together through cable $1'_{22-31}$. Line $1'_{31-32}$ represents the internal electrical link between the bottom ends of the antenna segments connected to feedthrough connectors $B_{31}$ and $B_{32}$. Vacuum feedthrough connector terminal $B_{32}$ connects to terminal $B_{41}$ via external cable line $1'_{32-41}$. Line $1'_{41-42}$ represents the internal electrical link between the bottom ends of the antenna segments connected to feedthrough connectors $B_{41}$ and $B_{42}$. Finally, the vacuum feedthrough connector $B_{42}$ is connected to the second lead terminal of the second RF power supply 170 via electrical cable 174. Lines $1_{11-12}$ through $1_{41-42}$ (forming a first ICP coil within the PVD process chamber) and lines $1'_{11-12}$ through $1'_{41-42}$ (forming a second orthogonal ICP coil within the PVD process chamber) represent the external and internal links forming two orthogonal ICP coils A and B connected to the first RF power supply 160 and second RF power supply 170, respectively, for the present embodiment of the invention. As shown in FIG. 5, antenna vacuum feedthrough terminal 168 is the first supply terminal for Cos(ωt) RF power supply 170 and antenna vacuum feedthrough terminal 167 is the second power supply terminal for Cos(ωt) RF power supply 170. Likewise, antenna vacuum feedthrough terminal 166 is the first power supply terminal for Sin(ωt) RF power supply 160 and antenna vacuum feedthrough terminal 169 is the second power supply terminal for Sin RF power supply 160.

These $1_{ij-mn}$ and $1'_{ij-mn}$ connections link the antenna segments to form a multi-zone ICP source surrounding the region between the PVD target 134 and substrate 138. The specific interconnection configuration shown in FIG. 5 provides an orthogonal two-zone configuration with two 4-turn coils with orthogonal axes located in a plane parallel to the target 134 and substrate 138. While each coil in FIG. 5 has 4 effective turns (in conjunction with eight vacuum feedthrough connectors $A_{ij}$ and $B_{ij}$ for each of the two orthogonal coils), the number of coil turns in each coil may be selected to be either larger or smaller than 4. The optimal number of the coil turns depends on the PVD chamber and target size.

FIGS. 4 and 5 describe one embodiment of the multi-zone ICP-enhanced ionized PVD design. As shown on FIG. 4, the multi-segment and multi-zone ICP source design employs multiple vertical RF antenna segments mounted near the inner wall of process chamber 102 around cathode/target assembly 134 and temperature-controlled chuck assembly 140 within the vacuum PVD chamber 100. The axial antenna segments are arranged cylindrically around and substantially vertical to the target plate 134. The total number of axial or vertical antenna segments can vary from as few as four to greater than twenty segments. In general, the number of axial antenna segments can be 4N (N=1, 2, 3, . . .). As shown on FIG. 5, the preferred embodiment of this invention for processing 200-mm wafers employs sixteen antenna segments. FIG. 5 also shows the superimposed images of a 200-mm wafer 176 and a 300-mm cathode/target 178. Preferably, the antenna segments are placed vertically around a cylinder with the cylinder diameter larger than the target 134 diameter and smaller than the PVD process chamber wall 102 diameter.

Figure 10:
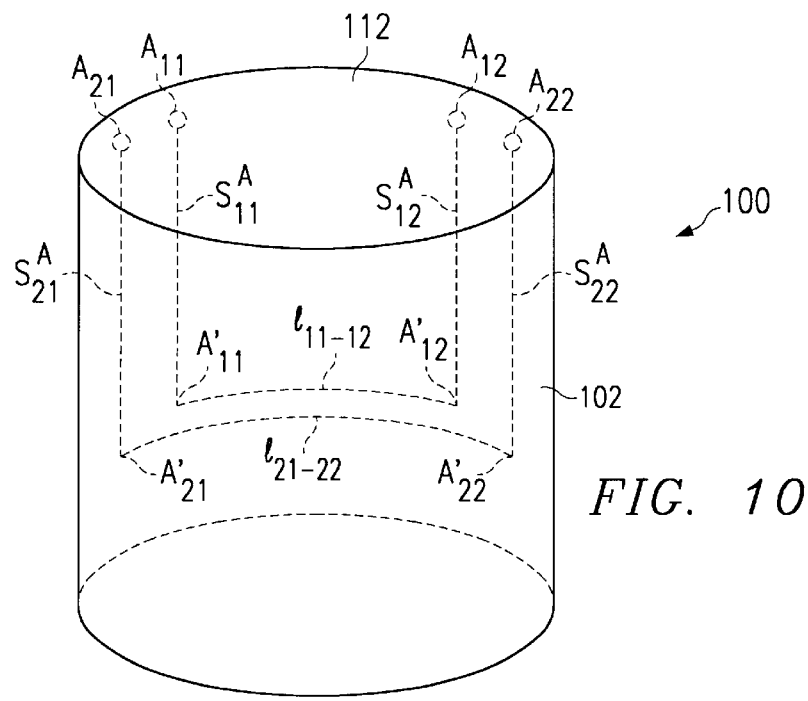
FIG. 10 illustrates a three-dimensional cylinderical configuration for the circuitry of FIGS. 6 through 9 with the circuitry conformal to the shape of a typical fabrication reactor process chamber.

The multi-zone (multi-segment) inductively-coupled-plasma-enhanced (ICP-enhanced) ionized PVD design shown in FIGS. 4 and 5 employs sixteen coaxial vacuum RF feedthrough connectors ($A_{11}$, $A_{12}$, . . . , $B_{11}$, $B_{12}$, . . .) connected to sixteen axial inductive antenna segments. The inductive antenna segments and their corresponding RF feedthrough connectors s are partitioned into two groups (Group A and Group B) of eight where (Group A consists of segments $S^A_{11}$, $S^A_{12}$, $S^A_{21}$, $S^A_{22}$, $S^A_{31}$, $S^A_{32}$, $S^A_{41}$ and $S^A_{42}$ and Group B consists of $S^B_{11}$, $S^B_{12}$, $S^B_{21}$, $S^B_{22}$, $S^B_{31}$, $S^B_{32}$, $S^B_{41}$ and $S^B_{42}$). These two inductive antenna groups are wired as two orthogonal inductive coupling sources, with Group A segments wired to form inductive coupling source A and Group B segments interconnected to form inductive coupling source B. These two orthogonal sources have their axes perpendicular to each other (with both orthogonal coil axes parallel to the target/cathode surface and/or substrate) and configured as shown on FIG. 5. Inductive source A is formed as follows: The antenna segment $S^A_{11}$ (with feedthrough terminal $A_{11}$ and vacuum end $A'_{11}$) is paired with the antenna segment $S^A_{12}$, having feedthrough terminal $A_{12}$ and vacuum end $A'_{12}$. Terminal $A_{11}$ of antenna segment $S^A_{11}$ externally connects to a first RF power supply 160 [$A_0$ sin(ωt)]. On the vacuum side within the PVD chamber, the vacuum end $A'_{11}$ of antenna segment $S^A_{11}$ internally connects to the vacuum end $A'_{12}$ of the antenna segment $S^A_{12}$ via electrical link $1_{11-12}$. In practice, link $1_{11-12}$ is continuous and integral to antenna segments $S^A_{11}$ and $S^A_{12}$. In other words, $S^A_{11}$, $S^A_{12}$ and $1_{11-12}$ comprise parts of a single or continuous tube (including vacuum feedthrough terminals $A_{11}$ and $A_{12}$ and vacuum ends $A'_{11}$ and $A'_{12}$) to allow a coolant fluid (compressed air or water) to run through the antenna segments (made of copper, aluminum, titanium, or another suitable material) and their associated vacuum links. All internal vacuum links such as $1_{11-12}$ can have appropriate curvatures and conform to the PVD chamber wall in order to prevent blockage of the wafer-to-target line-of-sight view. Links $1_{11-12}$ and $1_{21-22}$ as shown in FIG. 10 further illustrate this conformal arrangement.

Figure 6:
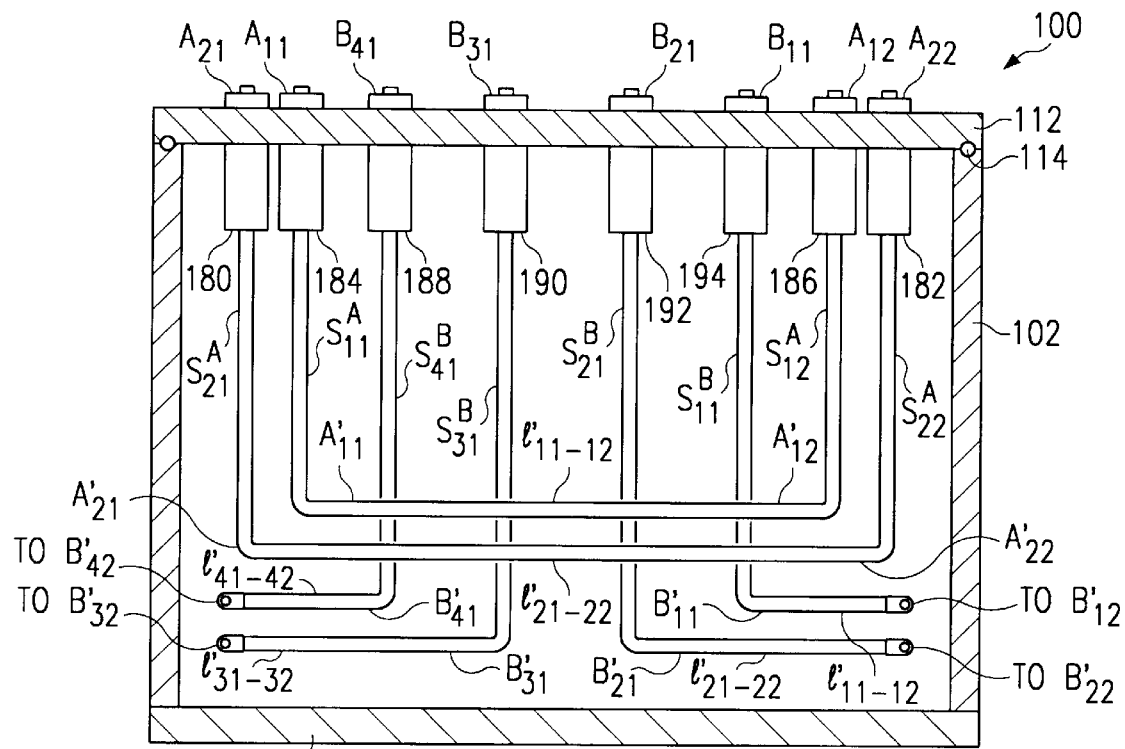
FIGS. 6 through 9A provide conceptual cross-sectional views of the ionized PVD module of the embodiment of FIG. 4.
Figure 7:
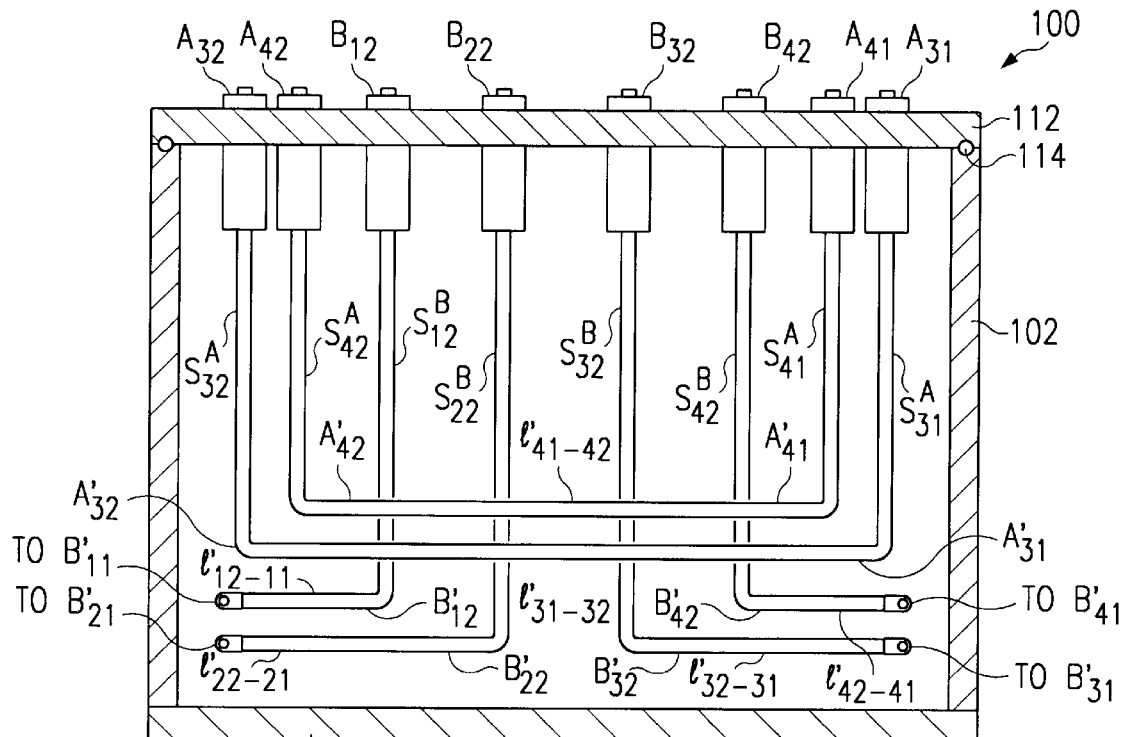
Figure 8:
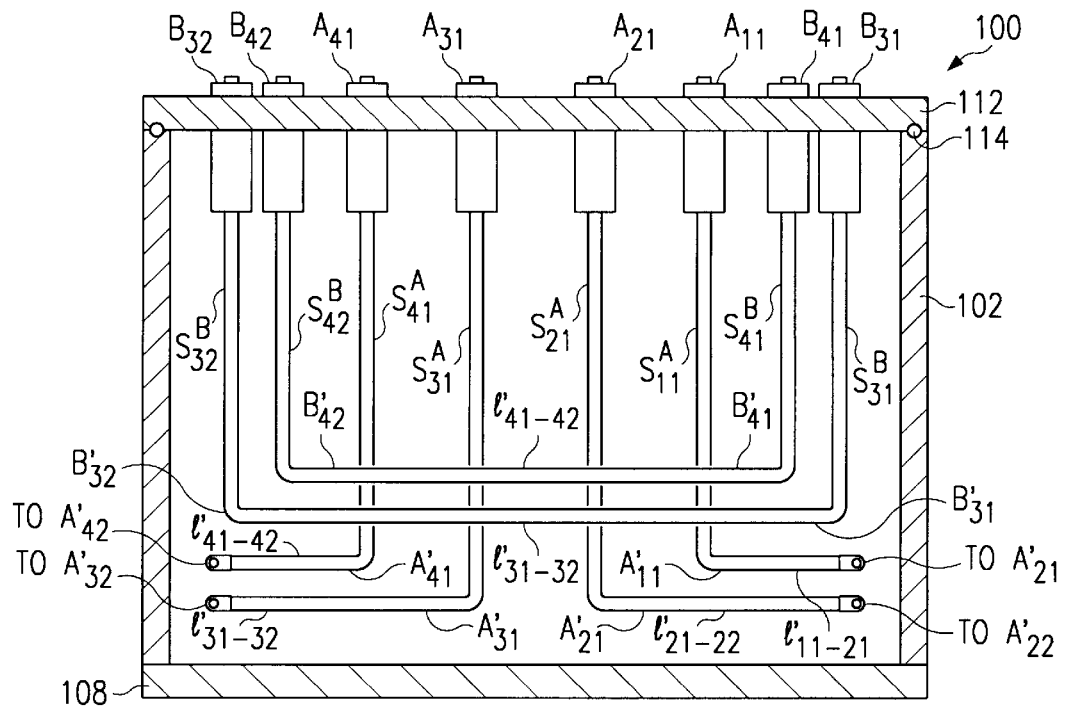
Figure 9:
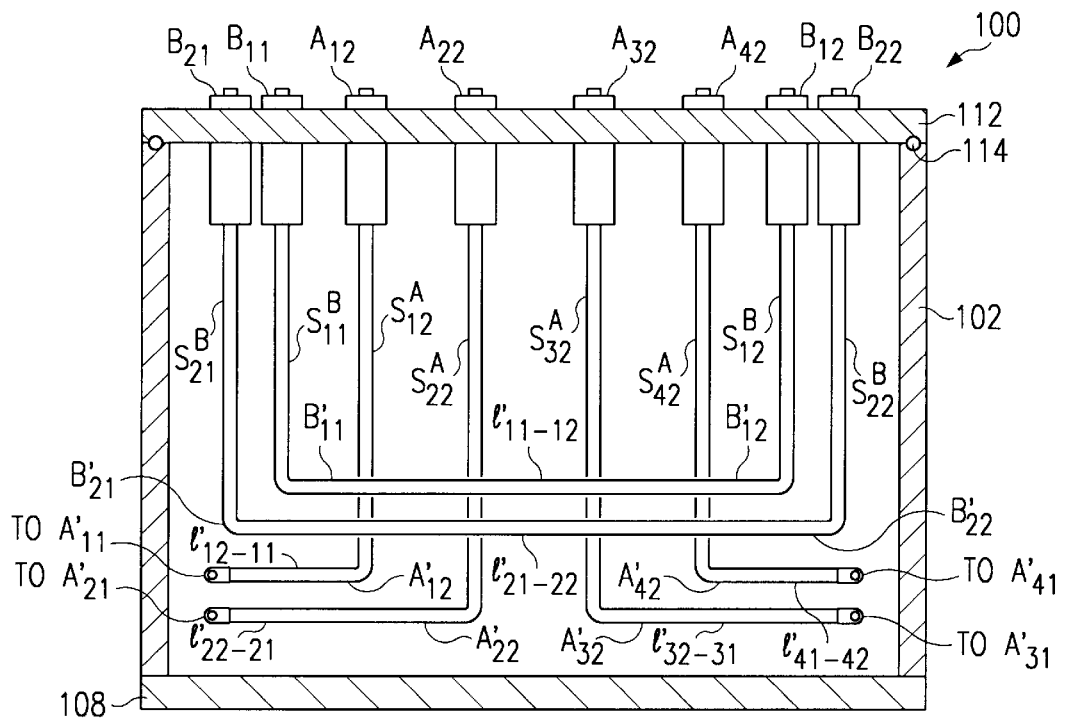

FIG. 5 also shows cross-section lines C—C and D—D for the purpose of illustrating cross-sectional schematic diagrams such as those in FIGS. 6s through 9. FIGS. 6 and 7 show side cross-sectional views of the ionized PVD chamber along the C—C line of dissection according to the arrows on FIG. 5. Moreover, FIGS. 8 and 9 show side cross-sectional views of the ionized PVD chamber along the D—D dissection line according to the view direction shown by the arrows on FIG. 5. FIGS. 6 through 9A represent cross sectional views of the embodiment of FIGS. 4 and 5 to illustrate the feedthroughs and electrical connections for that embodiment. FIG. 6 will be described in detail. The descriptions for FIGS. 7 through 9A are similar and will not be repeated.

In FIG. 6, multi-segment antenna feedthrough terminals $A_{21}$, $A_{11}$, $B_{41}$, $B_{31}$, $B_{21}$, $B_{11}$, $A_{12}$, and $A_{22}$ pass through top vacuum plate (or PVD target lid) 112. Antenna terminal $A_{21}$, surrounded by coaxial shield 180, connects to axial (vertical) antenna segment $S^A_{21}$ that continues to antenna vacuum end $A'_{21}$. Through internal link $1_{21-22}$, antenna base $A'_{21}$ connects to antenna vacuum end $A'_{22}$ coupled to axial antenna segment $S^A_{22}$ which goes to multi-segment antenna feedthrough terminal $A_{22}$ surrounded by coaxial shield 182. Antenna vacuum feedthrough terminal $A_{11}$, surrounded by coaxial shield 184, connects to axial antenna segment $S^A_{11}$ that continues to antenna vacuum end $A'_{11}$. Through internal inter-segment link $1_{11-12}$, antenna vacuum end $A'_{11}$ connects to antenna vacuum end $A'_{12}$. Antenna vacuum end $A'_{12}$ joins axial antenna segment $S_{12}^A$ that couples to antenna feedthrough $A_{12}$ surrounded by coaxial shield 186. Antenna feedthrough $B_{41}$ includes coaxial shield 188 and connects to axial antenna segment $S_{41}^B$, which connects to antenna vacuum end $B'_{41}$. Antenna vacuum end $B'_{41}$ connects via inter-segment link $1'_{41-42}$ to antenna vacuum end $B'_{42}$. Antenna feedthrough $B_{31}$, surrounded by coaxial shield 190, connects to axial antenna segment $S_{31}{}^B$. Axial antenna segment $S_{31}{}^B$ connects to antenna vacuum end $B'_{31}$, which leads to antenna vacuum end $B'_{32}$ via inter-segment link $1'_{31\text{-}32}$. Antenna feedthrough $B_{21}$, surrounded by coaxial shield 192, connects to axial antenna segment $S^B{}_{21}$ that connects to antenna vacuum end $B'_{21}$. Antenna vacuum end $B'_{21}$ connects to antenna vacuum end $B'_{22}$ via inter-segment link $1'_{21\text{-}22}$. Antenna feedthrough $B_{11}$, surrounded by coaxial shield 194, connects to axial antenna segment $S^B{}_{11}$ which goes to antenna vacuum end $B'_{11}$. Through inter-segment link $1'_{11\text{-}12}$, antenna vacuum end $B'_{11}$ connects to antenna $B'_{12}$. Similarly, the description of the cross-sectional views of FIGS. 7 through 9A follow the description of FIG. 6. Reference to the respective antenna feedthrough, axial antenna segment, antenna base, and inter-segment link designators describe particularly the connections of the present embodiment.

FIG. 6 shows the antenna segments $S_{21}{}^A$ and $S_{22}{}^A$ (coupled through link $1_{21\text{-}22}$), $S_{11}{}^A$ and $S_{12}{}^A$ (coupled through link $1_{11\text{-}12}$), and several other antenna segments related to the inductive source "B". Inductive coupling source "A" includes the $S^A$ antenna segments, "A" terminals, "A" vacuum ends, and the associated links. Atmospheric end $A_{12}$ of the antenna segment $S^A{}_{12}$ connects to $A_{21}$ of $S_{21}{}^A$. The vacuum end $A'_{21}$ of $S^A{}_{21}$ internally links to $A'_{22}$ of $S^A{}_{22}$ (via internal link $1_{21\text{-}22}$). The atmospheric end $A_{22}$ of antenna segment $S^A{}_{22}$ is externally connected to $A_{31}$ of $S^A{}_{31}$ via external line $1_{22\text{-}31}$. The vacuum end $A'_{31}$ of $S^A{}_{31}$ is connected to $A'_{32}$ of $S^A{}_{32}$ (via link $1_{31\text{-}32}$). The atmospheric end $A_{32}$ of $S^A{}_{32}$ is externally connected to $A_{41}$ of $S^A{}_{41}$, via external link $1_{32\text{-}41}$. Moreover, the vacuum end $A'_{41}$ of $S_{41}{}^A$ is internally connected to $A'_{42}$ of $S^A{}_{42}$ via link $1_{41\text{-}42}$. Finally, atmospheric terminal $A_{42}$ connects to the second terminal 164 of the first RF power supply $A_0 \sin\omega t$ 160. This completes formation of the inductive source A. Note that all the RF feedthroughs include series RF capacitors inserted externally between the external electrical links and the RF feedthroughs (located relatively close to the RF feedthroughs). These series capacitors can be used to produce series "LC" resonance conditions at the excitation RF frequency (for instance, approximately 13.56 MHZ), resulting in reduced induced RF voltages within the inductive sources A and B. This will ensure that the inductive sources will have pure inductive power coupling to the plasma with negligible capacitive coupling and antenna sputtering effects. This is a major advantage of the technology of this invention compared to the prior art ionized PVD designs having a single continuous coil inside the PVD chamber.

Inductive source B is configured similarly to inductive source A but with 90° rotation with respect to inductive source A. Again, all the RF feedthroughs for the inductive source B are connected to series RF capacitors outside the PVD chamber. As shown in FIG. 5, atmospheric terminal $B_{11}$ of antenna segment $S^B{}_{11}$ connects to one terminal 172 of a second RF power supply ($B_0 \cos \omega t$) 170 with 90° phase shift relative to the first RF power supply 160 used for inductive source A. The vacuum end $B'_{11}$ of the antenna segment $S^B{}_{11}$ is internally connected to $B'_{12}$ of $S^B{}_{12}$ through an internal link $1'_{11\text{-}12}$. The atmospheric terminal $B_{12}$ of $S^B{}_{12}$ segment is externally connected to terminal $B_{21}$ of antenna segment $S^B{}_{21}$. The vacuum end $B'_{21}$ of antenna segment $S^B{}_{21}$ is internally connected to $B'_{22}$ of antenna segment $S^B{}_{22}$ via link $1'_{21\text{-}22}$. The atmospheric terminal $B_{22}$ of $S^B{}_{22}$ is externally connected to terminal $B_{31}$ of antenna segment $S^B{}_{31}$. The vacuum end $B'_{31}$ of $S^B{}_{31}$ is internally connected to $B'_{32}$ of $S^B{}_{32}$ via link $1'_{31\text{-}32}$. The atmospheric terminal $B_{32}$ of $S^B{}_{32}$ is externally connected to $B_{41}$ of $S^B{}_{41}$. Moreover, the vacuum end $B'_{41}$ of $S^B{}_{41}$ is internally connected to $B'_{42}$ of $S^B{}_{42}$ via link $1'_{41\text{-}42}$. Finally, the atmospheric terminal $B_{42}$ is externally wired to the second terminal 174 of the $B_0 \cos \omega t$ power supply 170. This completes the formation of the inductive "B" source.

The magnetic field lines of the inductive sources A and B are substantially perpendicular to each other in a relatively large volume in the center of the reactor process chamber. As a result, the resulting inductively coupled magnetic field rotates at the excitation RF frequency. This should result in enhanced uniformity and increased ionization of the sputter flux emitted towards the substrate.

In order to prevent RF radiation and magnetic field effects of the external connectors, all the external connectors can employ high-$\mu$ jackets or permeable magnetic shields. The high-$\mu$ magnetic shields of the external connectors ensures that the magnetic field within the PVD chamber (produced by the antenna segments) is not significantly distorted by the magnetic field produced by the external RF connectors. Thus, each external RF connector may have two jackets around the RF line: one high-$\mu$ jacket to contain and shield the magnetic field and a second outer coaxial shield to prevent RF electromagnetic radiation. This is shown schematically in FIG. 9A, where first high-$\mu$ jacket 22 surrounds RF connector 21 while second electrically conductive RF shield 20 surrounds both the RF connector 21 and high-$\mu$ jacket 22.

As shown in the schematic diagrams of FIGS. 6 through 9A, the internal vacuum links may be configured in four different levels in order to prevent interference or significant cross-talk among the links. These internal links will be typically below the substrate plane during normal wafer processing. This ensures that the magnetic fields produced by the internal links do not significantly interfere with the main rotating ionization field produced by the vertical antenna segments.

FIG. 10 illustrates a PVD chamber configuration useable for the ionized PVD inductive coils of FIGS. 6 through 9A with conformance of the inductive coil circuitry to the shape of a typical fabrication reactor process chamber. Process chamber 100 includes top vacuum plate 112 (shown in FIG. 4) including antenna feedthrough terminals $A_{11}$, $A_{12}$, $A_{21}$, and $A_{22}$. FIG. 10 is illustrative and could include additional terminals. Antenna feedthrough terminals $A_{11}$ and $A_{12}$ couple to axial antenna segments $S^A{}_{11}$ and $S^A{}_{12}$ that lead to antenna vacuum ends $A'_{11}$ and $A'_{12}$. Inter-segment link $1_{11\text{-}12}$ connects antenna bases $A'_{11}$ and $A'_{12}$. Inter-segment link $1_{11\text{-}12}$ may be formed around the processing environment of processing chamber 100 to conform to the curvature of process chamber wall 102. Likewise, antenna feedthrough terminals $A_{21}$ and $A_{22}$ connect to axial antenna segments $S^A{}_{21}$ and $S^A{}_{22}$. Antenna vacuum end $A'_{21}$ connects to axial ON antenna segment $S^A{}_{21}$. Antenna vacuum end $A'_{22}$ connects to axial antenna segment $S^A{}_{22}$. Inter-segment link $1_{21\text{-}22}$ connects antenna bases $A'_{21}$ and $A'_{22}$ and conforms to the curvature of process chamber wall 102. Inter-segment link $1_{21\text{-}22}$ may be positioned with respect to inter-segment link $1_{11\text{-}12}$ to avoid cross-talk or interference with inter-segment link $1_{11\text{-}12}$. Likewise, antenna segments and links of the present invention can be formed to avoid interference with the up/down movement of chuck 140 in the plasma environment of the process chamber 100.

Figure 11:
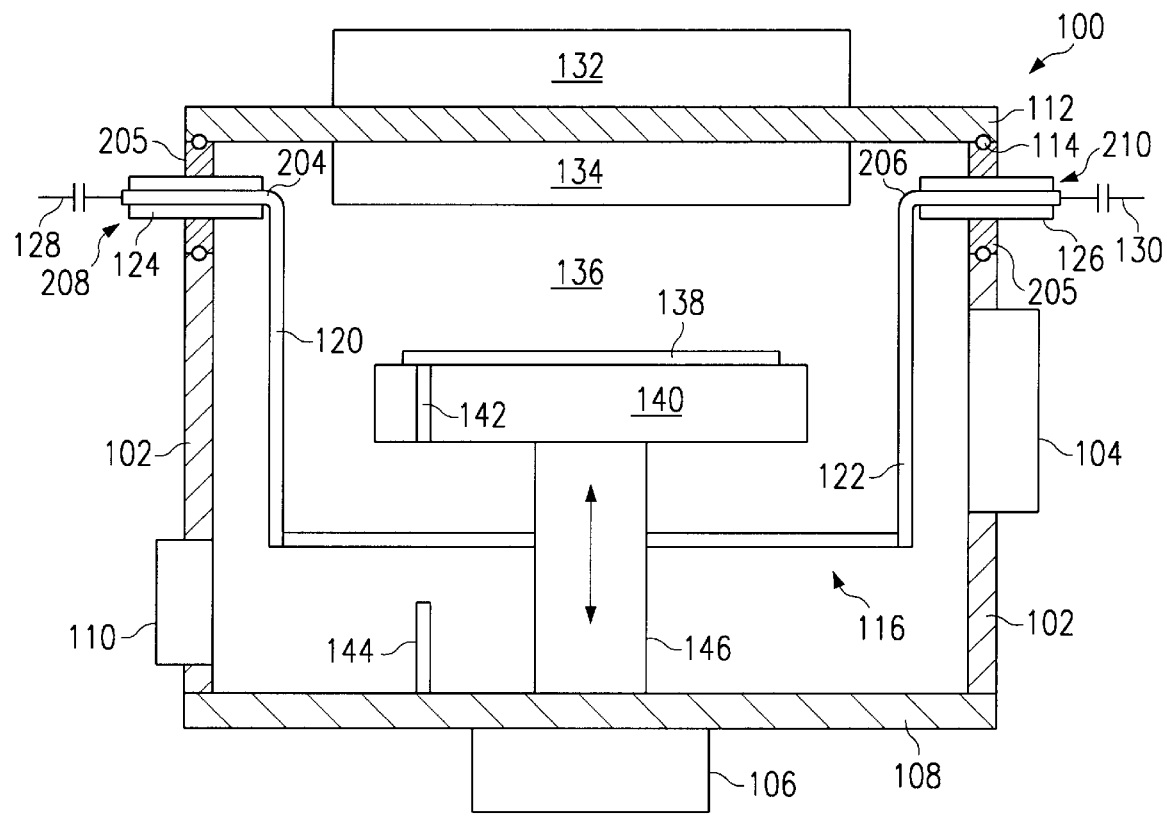
FIG. 11 shows a PVD fabrication process chamber with another embodiment of the invention.

FIG. 11 shows a side cross-sectional view of process chamber 100 according to an alternative embodiment of the present invention. Generally, the description of FIG. 11 follows that of FIG. 4. Process chamber 100 includes vacuum chamber sidewalls 102 to which pump port 104 attaches (alternatively, pump port may be at the bottom of vacuum process chamber 100.) Chuck drive 106 attaches to vacuum base plate 108 of process chamber 100. Wafer transport access valve 110 permits wafer load/unload to and from the vacuum process chamber 100. Vacuum chamber lid 112 seals process chamber 100 through vacuum seal 114 to chamber 102. FIG. 11 shows two antenna portions of the multi-segment rotating field inductively coupled plasma source 116 for ionized PVD according to the present embodiment of the invention. In particular, rotating field ICP source 116 includes a plurality of axial antenna segments, including antenna segments 120 and 122 that connect to vacuum feedthroughs 208 and 210 with coaxial shield 124 and 126. Each antenna segment couples to an RF capacitor, as shown by RF capacitors 128 and 130 coupled to antenna segments 120 and 122, respectively. Axial antenna segments 120 and 122 include elbow segments 204 and 206, respectively. Elbow segments 204 and 206 cause axial antenna segments 120 and 122, respectively, to emanate through vacuum chamber collar insert 205 to form feedthroughs 208 and 210, respectively. Capacitor 128 couples to antenna segment 120 via antenna feedthrough 208, while capacitor 130 couples to antenna segment 122 via antenna feedthrough 208. Rotating magnet array assembly 132 associates with top vacuum plate 112 above cathode/target 134. Cathode/target 134 is separated by adjustable wafer-to-target spacing 136 from semiconductor wafer 138. Semiconductor wafer 138 rests upon temperature controlled adjustable height chuck 140. Chuck 140 includes passage way 142 for receiving wafer lift pin 144. Wafer lift pin 144 permits lifting semiconductor wafer 138 as chuck drive shaft 146 moves chuck 140 downward (to enable wafer load and unload).

Figure 12:
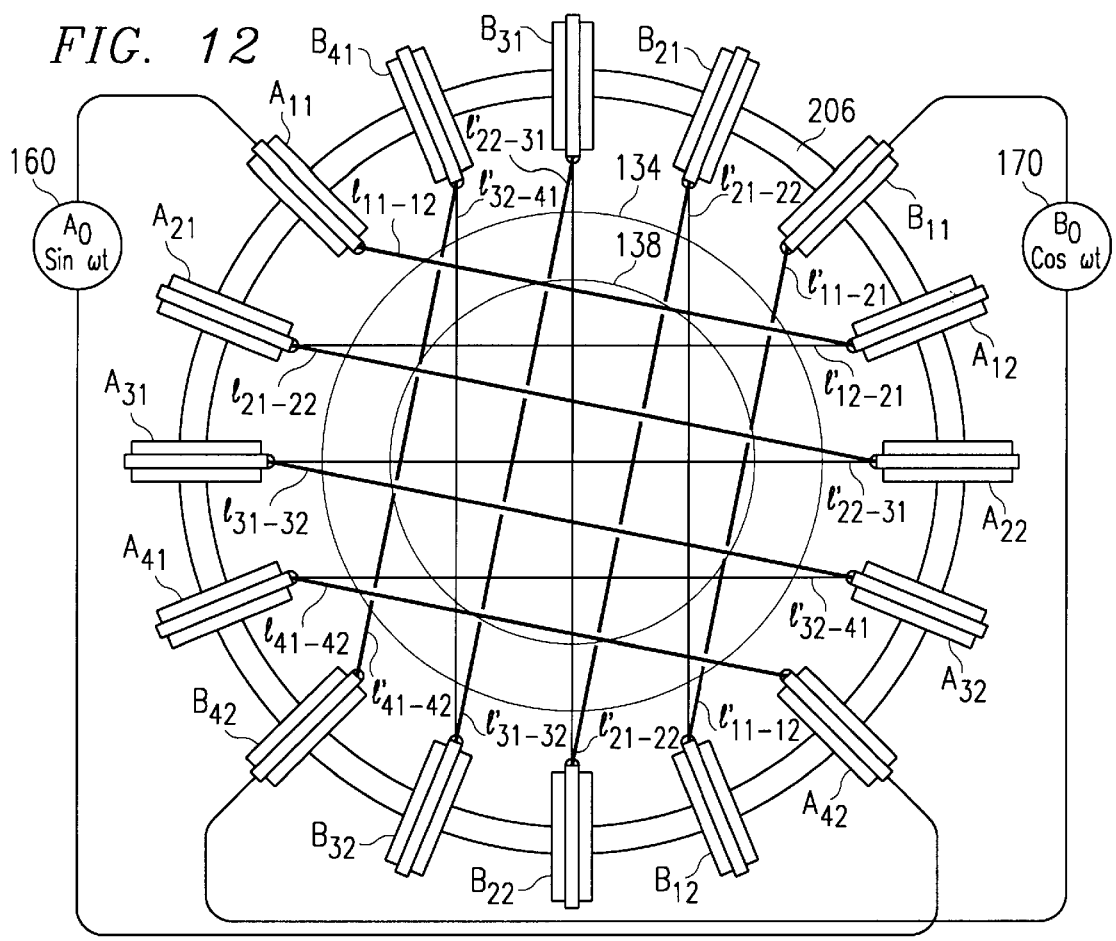
FIG. 12 shows the antenna array connections of the embodiment described in FIG. 11.

FIG. 12 shows the antenna array and radial feedthrough configuration of the FIG. 11 alternative embodiment. The description for FIG. 12 follows in large part the description of FIG. 5. The principal distinction being that as opposed to antenna feedthroughs passing through top vacuum plate 112, they pass through vacuum collar insert 205.

The schematic diagram shown in FIG. 4 indicates the RF antenna feedthroughs mounted over the PVD process chamber 100 around the PVD cathode/target assembly 134. The configuration of FIG. 10 allows the RF feedthroughs, related antenna segments, and internal links to form an integral part of the PVD cathode/target vacuum plate assembly. Alternatively, FIG. 11 shows an embodiment wherein the UHV RF feedthroughs mount radially around the cylindrical process chamber wall 102 through add-on chamber collar 205 inserted between the main PVD vacuum chamber 136 and the cathode/target vacuum plate 112. This configuration allows the ICP ionization source 116 to be implemented as an add-on module to existing PVD modules without having to modify the PVD process module and/or cathode/target assembly designs. This configuration also adds an extra vacuum seal made from a conflate metal seal or a metal wire seal for UHV base pressure performance ($10^{-8}$ to $10^{-9}$ Torr base pressure range). For the radial feedthrough implementation shown in FIG. 11, the vertical antenna segments pass through radially mounted coaxial RF feedthroughs. As a result, the antenna tubings require 90° bends from the feedthroughs.

Figure 13:
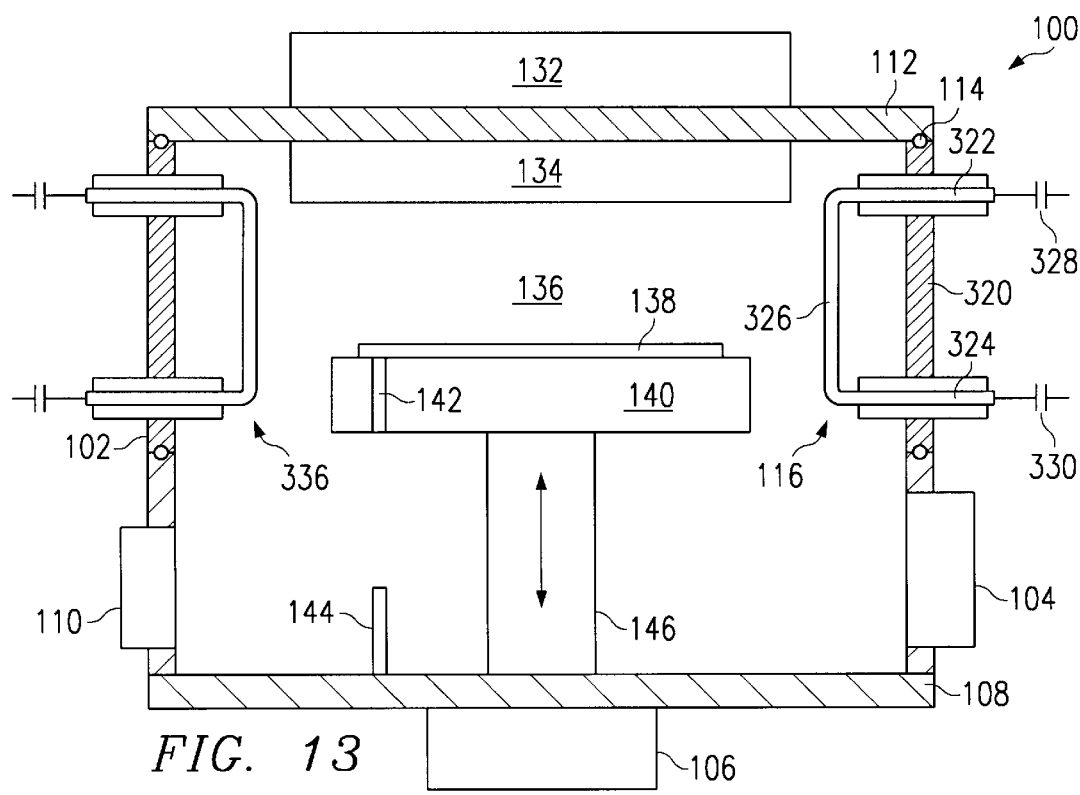
FIG. 13 depicts an alternative embodiment of the present invention.

FIG. 13 shows another alternative embodiment of the multi-segment ionized PVD source 116 of the present invention. Process chamber 100 includes vacuum chamber sidewalls 102 to which vacuum pump port 104 attaches. Chuck drive 106 attaches to vacuum base plate 108 of process chamber 100. Vacuum chamber lid 112 seals process chamber 100 through elastomer O-ring seals 114 to sidewalls 102. FIG. 13 shows two antenna portions of the multi-segment rotating field inductively-coupled-plasma source 116 for ionized PVD according to the present embodiment of the invention. In particular, rotating field ICP source 116 includes a plurality of axial antenna segments, including antenna segments 326 and 336.

Figure 14:
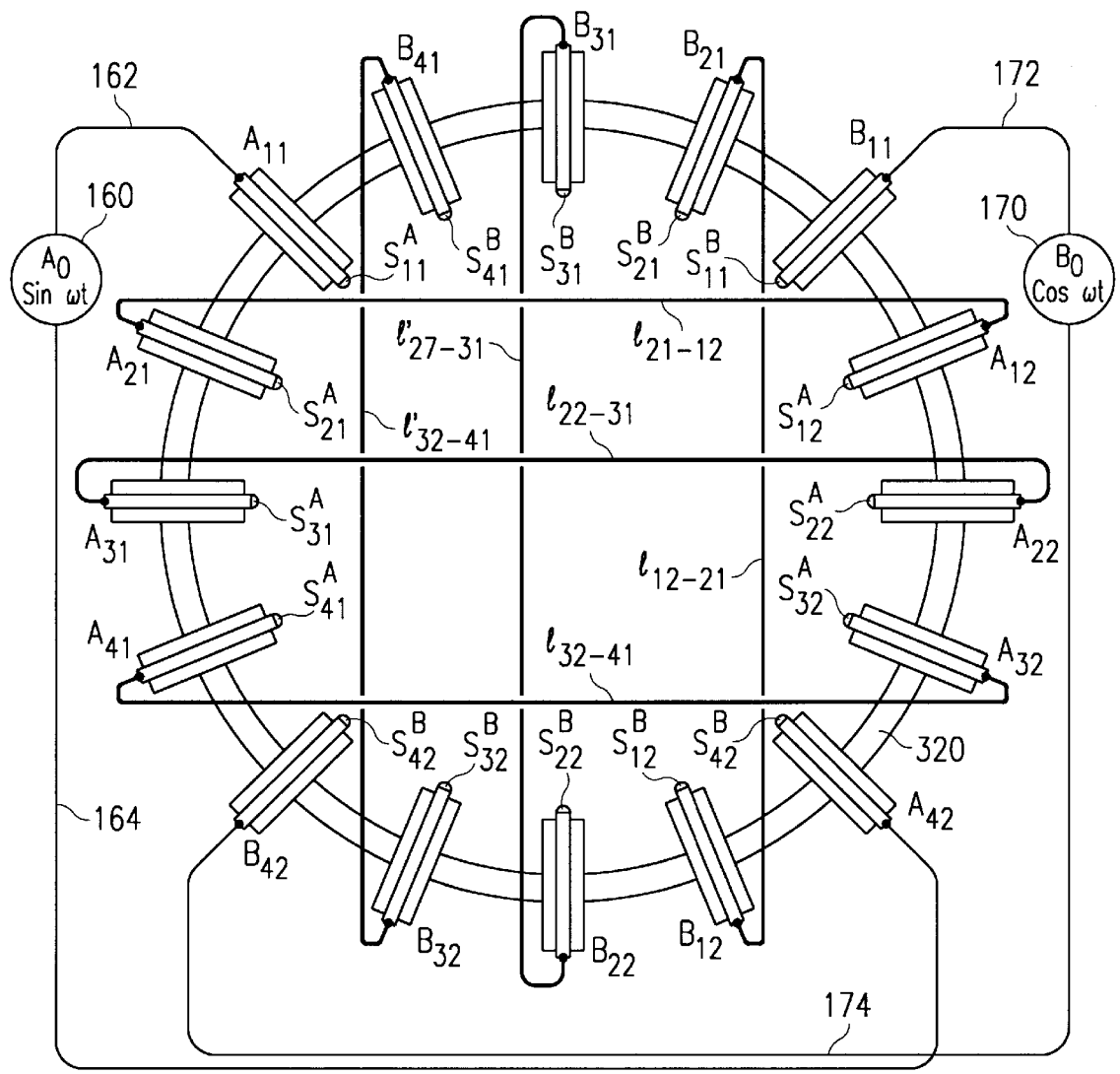
FIGS. 14 and 15 show coaxial RF connector feedthrough and electrical interconnection configurations for the FIG. 13 embodiment.
Figure 15:
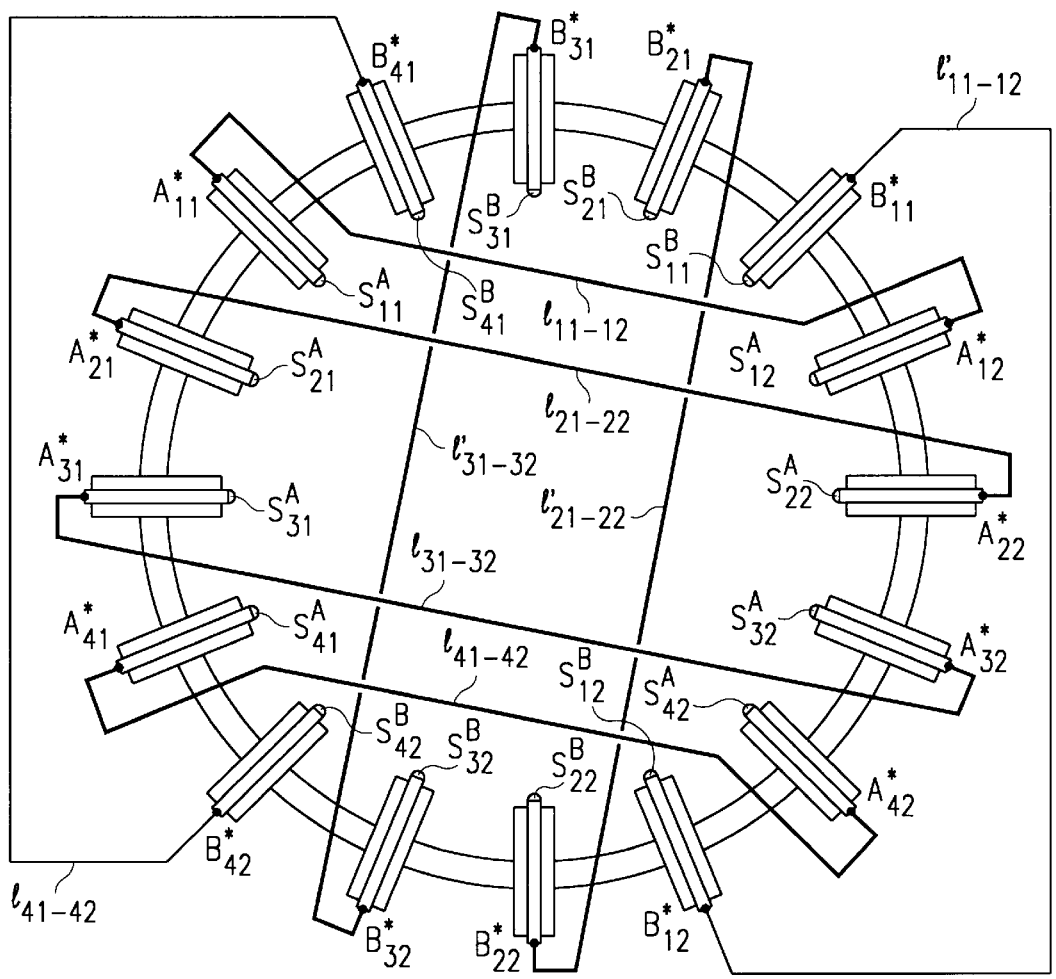

The alternative implementation of the multi-segment antenna ionized PVD shown on FIGS. 13, and 14 and 15 operates similar to the design shown in FIGS. 4 and 5. The main difference is that the alternative design (FIGS. 13–15) does not use internal links in the vacuum PVD chamber. All the antenna connections are made outside the vacuum chamber using external RF links as shown on FIGS. 14 and 15. FIG. 13 shows ionization source cylindrical insert collar 320 having upper UHV coaxial RF feedthrough 322 and lower UHV coaxial RF feedthrough 324 that connect to vertical or axial antenna segment 326. Series capacitors 328 and 330 connect, respectively, to upper UHV coaxial RF feedthrough 322 and lower UHF coaxial RF feedthrough 324.

Figure 9A:
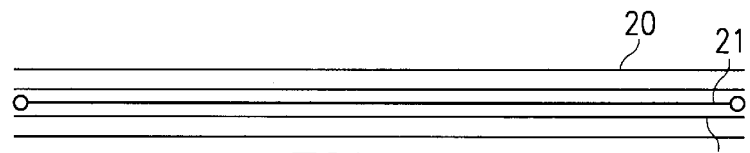

FIG. 14 shows the cross sectional or planar view of the external ionized PVD upper RF feedthrough electrical connections with their corresponding external RF links for the FIG. 13 embodiment contained outside the PVD vacuum chamber. FIG. 15 shows the lower coaxial RF feedthrough electrical connections and their corresponding external RF links. Again, all these links are external atmospheric links using shielded cables (as illustrated in FIG. 9A). For instance, the first RF power supply ($A_0$ Sin $\omega t$) 160 is connected to the RF feedthroughs $A_{11}$ and $A_{42}$ while the second RF power supply ($B_0$ Cos $\omega t$) 170 is connected to the terminals $B_{11}$ and $B_{42}$.

With the view to both FIGS. 14 and 15, the first power supply 160 ($A_0$ Sin $\omega t$) provides an RF excitation current (using a voltage source or a current source) to antenna feedthrough $A_{11}$ which passes through vacuum collar 320 to axial antenna segment $S^A_{11}$. Axial antenna segment $S^A_{11}$ connects to a lower RF feedthrough $A^*_{11}$. Line $1_{11-12}$ connects lower feedthrough $A^*_{11}$ to lower feedthrough $A^*_{12}$. Lower feedthrough $A^*_{12}$ connects to axial antenna segment $S^A_{12}$. Axial antenna segment $S^A_{12}$ connects to upper feedthrough $A_{12}$. Upper feedthrough $A_{12}$ connects to upper feedthrough $A_{21}$ via line $1_{21-12}$. Upper feedthrough $A_{21}$ connects to axial antenna segment $S^A_{21}$. Axial antenna segment $S^A_{21}$ connects to lower feedthrough $A^*_{21}$. Lower feedthrough $A^*_{21}$ connects, via line $1_{21-22}$, to lower feedthrough $A^*_{22}$. Lower feedthrough $A^*_{22}$ connects to axial antenna segment $S^A_{22}$. Axial antenna segment $S^A_{22}$ connects to upper feedthrough $A_{22}$. Upper feedthrough $A_{22}$ connects via line $1_{22-31}$ to upper feedthrough $A_{31}$. Upper feedthrough $A_{31}$ connects to axial antenna segment $S^A_{31}$ which connects to lower feedthrough $A^*_{31}$. Line $1_{31-32}$ connects lower feedthrough $A^*_{31}$ to lower feedthrough $A^*_{32}$. Lower feedthrough $A^*_{32}$ connects to axial antenna segment $S^A_{32}$. Axial antenna segment $S^A_{32}$ connects to upper feedthrough $A_{32}$ which, via Line $1_{32-41}$, connects to upper feedthrough $A_{41}$. The remainder of the antenna segments, upper feedthroughs, and lower feedthroughs connect similarly as shown in FIGS. 13, 14 and 15.

Like the first embodiment shown in FIGS. 4–9, the alternative ionized PVD embodiment shown in FIGS. 13–15 also generates a rotating inductively coupled magnetic field substantially parallel to the PVD target/cathode and substrate planes. The antenna segments of all three embodiments form a time-varying rotating magnetic field that allows more uniform physical-vapor deposition with a highly uniform and strong ionization efficiency for the sputtered species for ICP-enhanced ionized PVD collimation. The rotating inductively-coupled magnetic field of all three embodiments can be described as:

$$\overline{B_x} = (B_0 \sin \overline{\omega} t) \hat{a}_x;$$

$$\overline{B_y} = (B_0 \cos \overline{\omega} t) \hat{a}_y;$$

Where $\hat{a}_x$ and $\hat{a}_y$ are the unity vectors in the x and y directions and where $\overline{B_x}$ and $\overline{B_y}$ are the magnetic field vector components produced along the x and y axis directions by the inductive sources A and B, respectively. The net magnetic field $\overline{B}$ at the center of the PVD chamber is the vector sum of $\overline{B_x}$ and $\overline{B_y}$:

$$\overline{B} = \overline{B_x} + \overline{B_y} = B_0 [\sin(\omega t) \hat{a}_x + \cos(\omega t) \hat{a}_y)$$

Thus, $\overline{B}$ is a time-varying and rotating magnetic field produced in the bulk plasma between the wafer and target regions. The ICP-enhanced ionized PVD embodiments of this invention result in enhanced plasma density and increased ionization efficiency of the PVD sputter species at the substrate or work piece compared to the conventional and prior art PVD designs. In all three multi-segment antenna ionized PVD embodiments, the RF feedthrough tubings can be connected externally in series using electrically insulating plastic or ceramic tubing sections in order to cool down the internal ionization antenna segments using cooling water flow or gas (e.g., compressed air) flow (or any other fluid coolants). This will allow removal of the heat generated by RF and plasma losses in the antenna segments.

The embodiments of this invention can be effectively utilized to provide high degrees of PVD bottom and step coverage in high-aspect-ratio trench and via structures (such as those shown in FIGS. 2 and 3). By controlling the amounts of RF power to the ionized PVD ICP antenna section, and/or the RF (or DC) bias power to the substrate chuck, the degree of PVD collimation can be precisely controlled. For instance, for a given ICP RF power, the degree of PVD collimation can be adjusted and controlled by varying the amount of RF (or DC) bias power (or the resulting induced DC voltage) on the chuck and substrate. For a given ionized PVD antenna (ICP) RF power level, a higher chuck bias (RF or DC) power level will result in a higher degree of trench and via bottom coverage due to enhanced PVD collimation. Similarly, for a given level of chuck bias (RF or DC) power (or voltage), a higher amount of antenna RF power results in higher degree of bottom coverage in high-aspect-ratio trenches and vias. If desired, the ICP-assisted ionized PVD embodiments of this invention can be combined with the long-throw collimation approach to achieve even larger degrees of PVD collimation and bottom coverage. The ionized PVD embodiments of this invention, however, are applicable to a wide range of substrate-to-target spacings (larger spacings with long-throw collimation to smaller spacings without any long-throw collimation contribution).

The embodiments of this invention can be used for programmable Electrical Collimation (PEC) to provide excellent conformality including good sidewall step coverage and bottom coverage in trenches and vias. This can be done by using a multi-step recipe or a modulation-based recipe. For instance, a multi-step PVD process using one of the embodiments of this invention may use an initial (first) deposition step with a higher level of RF power to the inductive antenna and/or a higher level of RF (or DC) power applied to the substrate chuck to provide a very high degree of collimation for deposition step with reduced degree of deposition collimation (by lowering the amount of RF power to the inductive antenna and/or lowering the amount of RF or DC bias power applied to the substrate chuck). Similarly a multi-step PVD process using one of the embodiments of this invention may consist of an initial high-collimation step (with high antenna RF power and/or substrate chuck bias power) followed by a sequence of successively reduced collimation deposition steps by successively applying smaller amounts of RF power to the antenna and/or RF (or DC) bias power to the chuck. Another processing method using one of the embodiments of this invention employs continuously ramping down the antenna RF power and/or the substrate bias power (DC or RF) from an initial highest level to a final lowest level. This methodology would enable continuous coverage of high-aspect-ration trenches and vias with a relatively high degree of bottom coverage and sidewall step coverage conformality, by first effectively coating the bottoms of trenches and holes and then, gradually coating the sidewalls of the features from the bottom towards the top of the features.

The apparatus embodiments and methods of this invention offer numerous advantages over the conventional prior art physical collimation and long-throw collimation techniques. For instance, the conventional physical collimation and long-throw collimation techniques result in significant loss of the sputtered species due to material depositions on the physical collimator and/or chamber shields. This results in a requirement for frequent replacements of the physical collimator and/or the process chamber shields, resulting in reduced equipment utilization and uptime. Moreover, the physical and long-throw collimation techniques result in a significant reduction of the deposition rates (and processing throughput) compared to the non-collimated PVD processes. On the other hand, the embodiments and methods of this invention can provide controlled and adjustable degrees of deposition collimation without a significant reduction of the deposition rates and without compromising the processing throughput. Moreover, the embodiments and methods of this invention are superior to the prior art PVD collimation techniques in terms of the amount of wasted sputtered species and the frequency of chamber shield replacements. This is due to the fact that the embodiments of this invention result in less deposits on the chamber shields than the long-throw collimation technique. Moreover, there is no loss of sputtered flux due to a physical collimator between the target and the substrate.

The embodiments and methods of this invention enable collimated PVD over a wide range of operating pressures (e.g., 0.5 mTorr to 30 mTorr). This is superior to the conventional collimation techniques which can operate over smaller ranges of operating pressures (for instance, the long-throw collimation techniques require relatively low levels of operating pressures, typically less than 1 mTorr, to be effective). Moreover, the embodiments of this invention can be implemented in small volume vacuum chambers compared to the prior art long-throw collimation techniques (because the long-throw collimation PVD techniques require relatively large target-to-substrate spacings).

Another very important advantage of the embodiments and methods of this invention is the capability for real-time adjustment and control of the degree of deposition collimation over a wide range of values (from non-collimated deposition to extreme collimation). This is accomplished by varying the amounts of RF power to the antenna (which controls the degree of ionization) and/or RF (or DC or pulsed DC or AC) power applied to the chuck for substrate bias (which controls the ion energy/flux). The embodiments and methods of this invention allow real-time control of the PVD collimation without a need for any hardware activation or mechanical movements. On the other hand, the prior art physical collimation technique provides an essentially fixed degree of collimation as determined by the aspect ratio of the holes in the collimator plate; moreover, the long-throw collimation techniques provide only a limited range of collimation control through adjustments of the target-to-substrate spacing (which requires mechanical actuation and movement within the vacuum chamber).

In conjunction with a shutter, the embodiments of this invention can also be used to produce a plasma for plasma treatment of a substrate in an inert or reactive environment within the PVD process chamber (with the shutter closed and the target material isolated from the plasma). This type of in-situ plasma treatment of substrates can be used either before or after deposition of a material layer in the same PVD chamber.

While all the embodiments of this invention have been described with a plurality of antenna segments placed inside the ionized PVD process chamber, it is also possible to extend these embodiments to implement the antenna segments outside the ionized PVD process chamber. For instance, at least a portion of the ionized PVD process chamber can be made of an electrically insulting material (such a quartz, or a suitable ceramic material such as aluminum oxide or aluminum nitride or silicon carbide, or a suitable polymeric material) in order to allow penetration of electromagnetic field from the atmospheric side (outside the vacuum process chamber) into the ionized PVD low-pressure environment. Any of the embodiments of this invention can then be arranged around the electrically insulting portion of the ionized PVD process chamber in the atmospheric environment. The preferred embodiments, however, employ the plurality of the antenna segments within the low-pressure process chamber, as described in the detailed description of this invention.

Although the invention has been described in detail herein with reference to the illustrative embodiments, it is to be understood that this description is by way of example only and is not to be construed in a limiting sense. It is to be further understood, therefore, that numerous changes in the details of the embodiments of the invention and additional embodiments of the invention, will be apparent to, and may be made by, persons of ordinary skill in the art having reference to this description. It is contemplated that all such changes and additional embodiments are within the spirit and true scope of the invention as claimed.

What is claimed is:

1. A physical-vapor deposition system for depositing a material layer onto a substrate, comprising:
   a low-pressure process chamber for processing a substrate;
   a chuck assembly for holding the substrate;
   a target assembly comprising a sputtering energy source and a target material exposed to the environment of said low-pressure process chamber;
   a processing medium between said target material and the substrate for generating a plasma within said environment of said low-pressure process chamber;
   a plurality of inductive coupling antenna segments associated and arranged substantially axially with respect to said low-pressure process chamber for inductively coupling an electromagnetic energy to said plasma; and a control system to adjust and control a time varying rotating magnetic ionization field to enhance collimation of said sputtered species.

2. The system of claim 1, wherein said plurality of inductive coupling antenna segments are positioned peripherally within said low-pressure process chamber for surrounding said processing medium.

3. The system of claim 2, wherein said plurality of inductive coupling antenna segments are positioned on a substantially cylindrical surface for surrounding said processing medium.

4. The system of claim 2 wherein said plurality of inductive coupling antenna segments are positioned on a substantially conic surface for surrounding said processing medium.

5. The system of claim 1 wherein said plurality of inductive coupling antenna segments are positioned peripherally outside said low-pressure process chamber for surrounding said processing medium.

6. The system of claim 1, wherein said plurality of inductive coupling antenna segments electrically interconnect to form at least one inductive coupling source powered by a radio-frequency power supply.

7. The system of claim 6, wherein said inductive coupling source and said radio-frequency power supply cooperate to produce a time-varying magnetic field within said processing medium, said time-varying magnetic field vector substantially parallel to the surface of said substrate at the center of said processing medium.

8. The system of claim 6, wherein an electrical bias power is applied to said chuck assembly in order to perform collimated thin-film deposition during a physical-vapor deposition process.

9. The system of claim 8, wherein said inductively coupled antenna segments are electrically interconnected via radio-frequency capacitors in order to reduce the induced radio-frequency voltage across said antenna segments for enhanced inductive coupling and suppressed capacitive coupling.

10. The system of claim 6, wherein said plurality of inductive coupling antenna segments electrically interconnect to form a first inductive coupling source powered by a first radio-frequency power supply, and a second inductive coupling source powered by a second radio-frequency power supply.

11. The system of claim 10, wherein said plurality of inductive coupling antenna segments are equally partitioned between said first inductive coupling source and said second inductive coupling source.

12. The system of claim 10, wherein said first inductive coupling source and said second inductive coupling source and first radio-frequency power supply and said second radio-frequency power supply cooperate to raise the ionization efficiency of a plasma formed in said processing medium.

13. The system of claim 10, wherein said first inductive coupling source and said first radio-frequency power supply cooperate to produce a first time-varying magnetic field within said processing medium, and said second inductive coupling source and said second radio-frequency power supply cooperate for producing a second time-varying magnetic field within said processing medium, and further wherein vector lines associated with said first magnetic field are substantially to the perpendicular vector lines associated with said second magnetic field, particularly at the center of said processing medium.

14. The system of claim 13, wherein said vector lines associated with said first magnetic field and said vector lines associated with said second magnetic field are substantially parallel to the surface of said substrate, particularly at the center of said processing medium.

15. The system of claim 14, further comprising a plurality of radio-frequency capacitors, each capacitor coupled to an antenna segment for producing a series resonance condition at the oscillation frequency of said first and second radio-frequency power supplies.

16. The system of claim 15, wherein the radio-frequency capacitors further reduce the induced radio-frequency voltages within said first inductive coupling source and said second inductive coupling source for providing pure inductive power coupling to the plasma and to minimize capacitive coupling and antenna sputtering effects.

17. The system of claim 14, further comprising a plurality of high-permeability magnetic shields surrounding the plurality of antenna terminals to reduce radio-frequency radiation and magnetic field effects.

18. The system of claim 14, further comprising a plurality of high-permeability magnetic shields surrounding the plurality of antenna terminals to reduce the magnetic field effects; and a plurality of coaxial shields surrounding the plurality of high-permeability magnetic shields to reduce the radio-frequency radiation effects.

19. The system of claim 13, wherein said first radio-frequency power supply and second radio-frequency power supply operate at a common oscillation frequency with a phase angle difference of approximately 90° for producing a rotating time-varying inductively-coupled magnetic field with a rotation frequency equal to the oscillation frequency of said first radio-frequency power supply and second radio-frequency power supply.

20. The system of claim 19, further comprising:

a plurality of radio-frequency capacitors, each radio-frequency capacitor coupled to an antenna segment, for producing a series resonance condition at the radio-frequency and wherein said radio frequency capacitors further reduce the induced radio-frequency voltages within said first inductive coupling source and said second inductive coupling source for providing pure inductive power coupling to the plasma for minimizing capacitive coupling and antenna sputtering effects;

a plurality of high-permeability magnetic shields surrounding said plurality of antenna terminals for reducing the magnetic field effects; and a plurality of coaxial shields surrounding said plurality of high-permeability magnetic shields for reducing said radio-frequency radiation effects.

21. The system of claim 13, wherein said first radio-frequency power supply comprises a sinusoidal source and said second radio-frequency power supply produces a sinusoidal power wave form with an approximately 90° phase shift with respect to said first radio-frequency power supply.

22. The system of claim 21, further comprising:

a plurality of radio-frequency capacitors, each radio-frequency capacitor coupled to an antenna segment for producing a series resonance condition at the radio-frequency and wherein the radio-frequency capacitors further reduce the induced radio-frequency voltages within said inductive coupling source and said second inductive coupling source for providing pure inductive power coupling to said plasma for minimizing capacitive coupling and antenna sputtering effects;

a plurality of high-permeability magnetic shields surrounding the plurality of antenna terminals for reducing the magnetic field effects; and a plurality of coaxial shields surrounding the plurality of high-permeability magnetic shields to reduce the radio-frequency radiation effects.

23. The system of claim 10, further comprising two sets of electrical links to interconnect the antenna segments to form said first inductive coupling source and said second inductive coupling source.

24. The system of claim 23, wherein at least a portion of said electrical links are outside said low-pressure processing chamber.

25. The system of claim 10, wherein the first radio-frequency power source and said second radio-frequency power source provide essentially sinusoidal output power waveforms with an oscillation frequency in the range of 1 MHz to 30 MHz.

26. The system of claim 6, further comprising a set of electrical links to interconnect the antenna segments to form said at least one inductive coupling source.

27. The system of claim 1, wherein said inductive coupling antenna segments comprise metallic tubings for flowing a coolant fluid during system operation, thereby cooling said inductive coupling antenna segments.

28. The system of claim 1, wherein said plurality of inductive coupling antenna segments further comprises a first set of linking segments linking the first half of the antenna segments and a second set of linking segments linking the second half of the antenna segments.

29. The system of claim 28, wherein said first and second set of links are configured to occupy a plurality of different levels within the process chamber for reducing interference among the internal links to prevent significant interference with the main rotating ionization field produced by said first inductive coupling source and said second inductive coupling source.

30. The system of claim 1, wherein said a control system achieves a programmed collimation of said low-pressure process chamber in real time.

31. The system of claim 30, wherein said control system implements said programmable collimation via a controlled electrical parameter.

32. The system of claim 31, wherein said controlled electrical parameter is at least one selected from the group consisting of substrate bias and ionization source RF power.

* * * * *